United States Patent
Kitamura

(10) Patent No.: US 7,454,736 B2
(45) Date of Patent: Nov. 18, 2008

(54) AUTOMATIC TRACE DETERMINATION APPARATUS AND COMPUTER PROGRAM THEREOF

(75) Inventor: Tamotsu Kitamura, Nagano (JP)

(73) Assignee: Shinko Electric Industries Co., Ltd. (JP)

( * ) Notice: Subject to any disclaimer, the term of this patent is extended or adjusted under 35 U.S.C. 154(b) by 231 days.

(21) Appl. No.: 11/387,257

(22) Filed: Mar. 22, 2006

(65) Prior Publication Data

US 2006/0225018 A1 Oct. 5, 2006

(30) Foreign Application Priority Data

Mar. 24, 2005 (JP) .............................. 2005/086035

(51) Int. Cl.
*G06F 17/50* (2006.01)

(52) U.S. Cl. .............................. 716/13; 716/12; 716/14

(58) Field of Classification Search .............. 716/12–14
See application file for complete search history.

(56) References Cited

U.S. PATENT DOCUMENTS

| | | | |
|---|---|---|---|
| 6,330,707 B1 * | 12/2001 | Shinomiya et al. ............ | 716/14 |
| 6,596,549 B2 | 7/2003 | Kitamura et al. | |
| 6,813,756 B2 * | 11/2004 | Igarashi et al. ................ | 716/14 |
| 7,096,449 B1 * | 8/2006 | Teig et al. ...................... | 716/12 |
| 7,117,468 B1 * | 10/2006 | Teig et al. ...................... | 716/11 |
| 2002/0035720 A1 | 3/2002 | Kitamura et al. | |

FOREIGN PATENT DOCUMENTS

JP   A 2002-083006   3/2002

OTHER PUBLICATIONS

Dayan, Tal, "Rubber-Band Based Topological Router," University of California, Santa Cruz (Jun. 1997).

Staepelaere et al., "Surf: A Rubber-Band Routing System for Multichip Modules", IEEE Design & Test of Computers, IEEE Service Center, NY, NY vol. 10. No. 4, pp. 18-26, Dec. 1993.

Dayan et al., "Layer Assignment for Rubber Band Routing", University of California, Santa Cruz, pp. 1-18, Jan. 1993.

(Continued)

*Primary Examiner*—Jack Chiang
*Assistant Examiner*—Magid Y Dimyan
(74) *Attorney, Agent, or Firm*—Walter G. Hanchuk; Chadbourne & Parke LLP

(57) ABSTRACT

An automatic trace determination apparatus comprises: first means that performs a first process sequentially for all intersections formed between tentative traces connecting between pads and corresponding vias, wherein the first process determines distances from an intersection formed between two tentative traces to the corresponding vias, respectively, and allows one of the two tentative traces associated with the longer distance to bypass the via, with which the other of the two tentative traces associated with the shorter distance is connected; and second means that performs a second process sequentially for all intersections formed between the interim traces themselves or between the interim and tentative traces, wherein the second process determines distances from an intersection to the vias corresponding to the interim or tentative traces, respectively, and allows one of the two tentative or interim traces associated with the longer distance to bypass the via, with which the other of the two tentative or interim traces associated with the shorter distance is connected, and defines this bypass trace as an optimal trace.

11 Claims, 25 Drawing Sheets

OTHER PUBLICATIONS

Dayan, "Rubber-Band Based Topological Router", University of California, Santa Cruz, pp. 89-129, Jun. 1997.

Cong et al., "Performance Driven Multi-Layer General Area Routing for PCB/MCM Designs", Design Automation Conference, Proceedings San Francisco, CA, IEEE, pp. 356-361, Jun. 1998.

Linsker, "An Iterative-Improvement Penalty-Function-Driven Wire Routing System", IBM Journal of Research and Development, USA, vol. 28, No. 5, Sep. 1984.

Shuenn-Shi et al., "An Automatic Router for the Pin Grid Array Package", Design Automation Conference, Proceedings of the ASP-DAC'99. Asia and South Pacific Wanchai, Hong Kong, pp. 18-21, IEEE, Jan. 1999.

European Search Report dated Jul. 17, 2006.

* cited by examiner

Fig. 37
 --- VIA
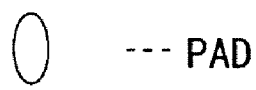 --- PAD
 --- NET TO BE WIRED
Fig. 38 (Prior Art)
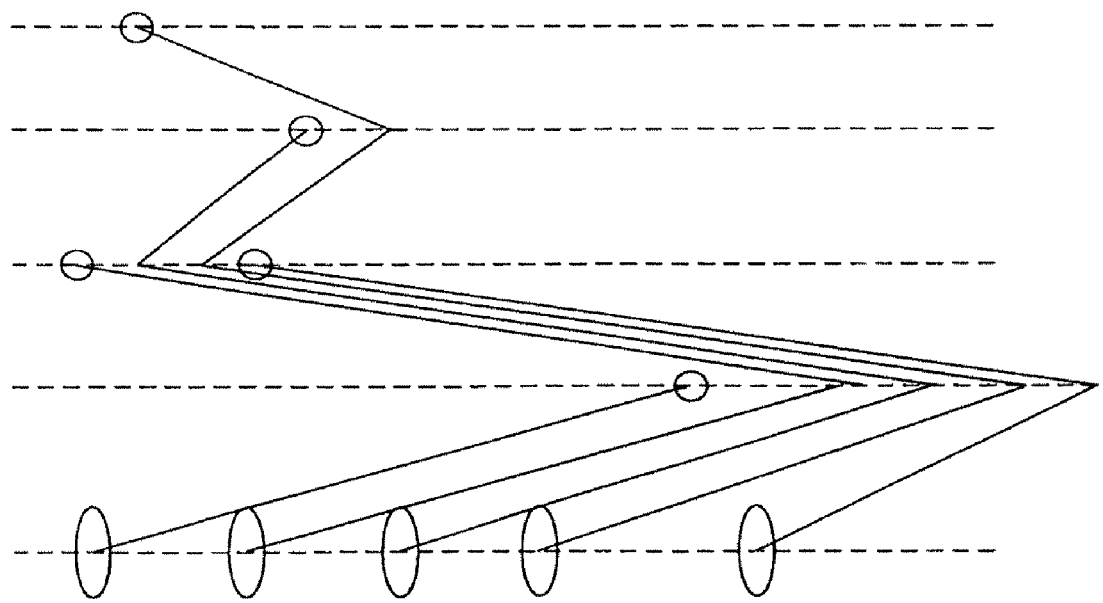

AUTOMATIC TRACE DETERMINATION APPARATUS AND COMPUTER PROGRAM THEREOF

BACKGROUND OF THE INVENTION

1. Field of the Invention

The present invention relates to an automatic trace determination apparatus for automatically determining optimal trace positions, from pads to corresponding vias on a substrate, by computation and a computer program for allowing a computer to perform this automatic trace determination process.

2. Description of the Related Art

In a semiconductor package such as a PBGA and an EBGA, electrode terminals of a semiconductor chip are electrically connected with pads (for example, wire bonding pads or flip-chip pads) and the pads are connected with vias (lands) and the vias are also connected with each other by traces (i.e., signal traces). Traces in the semiconductor package at least have to satisfy design rules in that clearances (of lines and spaces) between vias and traces and between traces themselves and so on can be secured and there is no unnecessary trace intersection (crossing). For example, a designer typically designs wiring routes of a semiconductor package by trial and error on a virtual plane using a CAD system.

FIG. 36 is a diagram illustrating nets to be wired in a semiconductor package. Hereinafter, when traces are shown in the accompanying figures, the shown traces are at least a portion of the traces on the substrate. Further, FIG. 37 is a diagram for describing legends of symbols for vias, pads and/or nets to be wired that are indicated in the figures attached to this specification. Hereinafter, the legends of FIG. 37 apply to figures showing the vias, pads and/or nets to be wired.

In a semiconductor package, traces are provided from pads connected with a semiconductor chip mounted in the center of a substrate toward vias provided in a peripheral region. In FIG. 36, as an example, nets to be wired from pads (bonding pads) arranged in a row to corresponding vias are indicated by straight lines (so-called "rats"). The traces in the semiconductor package have to secure clearances between the vias and the traces and between the traces themselves and eliminate unnecessary intersections between the traces. In the example shown in FIG. 36, there are intersections between the traces and, therefore, these intersections have to be resolved in the trace design.

As a wiring pattern design method that can automatically resolve the intersections described above, the present applicants invented a method in which only wiring routes are determined in advance in a rough wiring process and, then, in a trace formation process, traces are provided uniformly by checking clearances according to actual design rules and this invention is set forth in Japanese Unexamined Patent Publication No. 2002-083006. FIG. 38 is a diagram illustrating a trace design result in which the intersections between the nets shown in FIG. 36 are resolved by using a technique as set forth in Japanese Unexamined Patent Publication No. 2002-083006. In the figure, dotted lines indicate additional lines. This method sets the predetermined additional lines first and, then, determines the traces sequentially in the direction from the pads to the vias by using the additional lines.

Typically, in a semiconductor package, traces are provided from pads connected with a semiconductor chip mounted in the center of a substrate toward vias provided in a peripheral region and, therefore, the traces tend to be oriented in a substantially identical direction as shown in FIG. 38. In this specification, this direction of the traces is referred to as the "forward direction" and the traces oriented substantially in the forward direction are referred to as the "forward traces". Such forward traces can be implemented relatively easily by computation using a computer.

If wirings in a semiconductor package at least satisfy design rules as described above, it can be said that a certain measure of success is achieved. In effect, however, it is often required that the wiring pattern not only satisfies the design rules but also that the wiring pattern is a "beautiful pattern" that are arranged regularly in a well-balanced manner to some extent. This is because the "beautiful pattern" may often result in reduction of manufacturing costs, electrical resistance and so on. Further, as a result of the well-balanced pattern, deformation of a substrate due to variation of temperature, humidity and so on may be restricted.

FIG. 39 is a diagram illustrating a case in which wiring routes of the nets shown in FIG. 36 are designed so that the traces are disposed in a well-balanced manner after resolving the intersections. As shown in FIG. 39, if the traces can bypass appropriately, a significantly better-balanced pattern can be implemented in comparison with the case of FIG. 38. As described above, the wiring in the semiconductor package is typically formed as a "forward wiring". However, in actual cases, it is often advantageous that there are "routes that bypass vias (hereinafter simply referred to as the "bypass routes")" so that a portion of the traces is oriented in the direction substantially opposite to the dominant direction from various viewpoints such as reduction of manufacturing costs and electrical resistance, restriction of deformation of the substrate and so on. Further, if such bypass routes are allowed, the possibility for the traces to reduce clearance errors may be increased and a margin in the pattern design may be created. In this specification, the wiring having the bypass routes that are oriented in the direction substantially opposite to the dominant direction is referred to as the "retrograde wiring".

FIG. 40 is a diagram illustrating an example of a retrograde wiring. As shown in this figure, in the retrograde wiring, some traces may meander greatly and, therefore, it is difficult to automatize the wiring design by using a computer process. Therefore, at present, the designer designs the retrograde wiring manually depending on his experience and intuition. The designer designs optimal wiring routes that satisfy design rules and that do not include intersections between the wiring routes manually by making and modifying the wiring actually by trial and error while using a CAD/CAM system and viewing a display and, therefore, design quality and time required for design greatly depend on the designer's skill, experience, intuition and the like.

In the design of the retrograde wiring, a wiring method that reduces the burden on the designer and that implements the wiring design with stable quality is described in Tal Dayan, "A dissertation submitted in partial satisfaction of the requirements for the degree of doctor of philosophy in computer engineering", June 1997, University of California Santa Cruz, USA. FIGS. 41A-41C are diagrams showing a principle of generation of a retrograde wiring according to a technique as set forth in a document entitled "Rubber-Band Based Topological Router". Hereinafter, a character V combined with a numeral such as 1, 2 or so on is a reference symbol of vias, a character B combined with a numeral 1, 2 or so on is a reference symbol of pads, and a character W, W', w", W''', w, w' or w" combined with a numeral 1, 2 or so on is a reference symbol of traces. Further, a character Q or Q' combined with a numeral 1, 2 or so on is a reference symbol of intersections between the traces.

Here, as an example, it is assumed that a trace W1 connecting between a pad B1 and a via V1 intersects (crosses) with a trace W2 connecting between a pad B2 and a via V2 at an intersection Q1 as shown in FIG. 41A.

According to this technique, first, distances from the intersection Q1 formed between the two traces W1 and W2 to the vias V1 and V2, with which the two traces W1 and W2 are connected, respectively, are determined. In the example shown in FIG. 41A, the distance between the intersection Q1 and the via V2 is longer than the distance between the intersection Q1 and the via V1. As shown in FIG. 41B, the trace W2 associated with the longer distance is allowed to bypass the via V1, with which the trace W1 associated with the shorter distance is connected, so that the intersection Q1 can be resolved and the trace W2 is defined as a new trace W'2. As a result, retrograde wiring is generated as shown in FIG. 41C.

As described above, the trace associated with the shorter distance is not allowed to bypass the via with which the trace associated with the longer distance is connected but the trace associated with the longer distance is allowed to bypass the via with which the trace associated with the shorter distance is connected, because the increase in the total wiring length occurring as a result of this bypass can be more restricted in the latter case than in the former case.

In the technique as set forth in the document "Rubber-Band Based Topological Router", the retrograde wiring can be designed according to design rules to some extent, but it is difficult to apply this technique to a complicated wiring as shown in FIG. 40. This is because the trace that is allowed to bypass may be very likely to intersect with other traces but the technique as set forth in the document "Rubber-Band Based Topological Router" still does not solve such problem. Thus, the automatization of the retrograde wiring design is still not achieved under present circumstances. After all, the designer has to design wiring routes of a semiconductor package on a virtual plane by trial and error depending on the designer's experience and intuition while actually manipulating a CAD system. In such manual pattern design by trial and error, as the required wiring pattern becomes more complicated, the effort, time and difficulty for achieving the optimal wiring pattern is increased. Further, unevenness in quality of finished products is also increased. In reality, because the manual pattern design by trial and error requires about one to three weeks' work and it is not economical to waste further time for pattern designing, the designer has to compromise with a certain design quality.

In view of the above problems, it is an object of the present invention to provide an automatic trace determination apparatus that can determine trace positions automatically by computation when optimal trace positions from pads to corresponding vias on a substrate are designed, even if a portion of the traces tends to be oriented in the direction substantially opposite to the dominant direction, and to provide a computer program for allowing a computer to perform this automatic trace determination process.

SUMMARY OF THE INVENTION

In order to achieve the above object, according to the present invention, there is provided an automatic trace determination apparatus for automatically determining optimal trace positions from pads to corresponding vias on a substrate by computation, comprising: first intersection resolving means that performs a first intersection resolving process for all intersections formed between tentative traces connecting between the pads and the corresponding vias by straight lines sequentially from the intersection nearest to the pads, wherein the first intersection resolving process allows one of the tentative traces that forms an intersection with the other of the tentative traces to bypass the via, with which the other of the tentative traces is connected, so that the intersection formed between the two tentative traces can be resolved and defines this bypass trace as an interim trace; and second intersection resolving means that, after the first intersection resolving process is completed by the first intersection resolving means, performs a second intersection resolving process for all intersections formed between the interim traces themselves and intersections formed between the interim and tentative traces sequentially from the intersection nearest to the pads, wherein the second intersection resolving process allows one of the interim or tentative traces that forms an intersection with the other of the interim or tentative traces to bypass the via, with which the other of the interim or tentative traces is connected, so that the intersection formed between the interim traces themselves or the intersections formed between the interim and tentative traces can be resolved and defines this bypass trace as an optimal trace. In this automatic trace determination apparatus, the first and second intersection resolving means are implemented by an arithmetic processing unit such as a computer and/or a computer program that can be executed by the arithmetic processing unit such as the computer.

FIG. 1 is a principle block diagram of an automatic trace determination apparatus according to the present invention. Hereinafter, like reference numerals designate elements having like functions throughout the several views.

An automatic trace determination apparatus 1 for automatically determining optimal trace positions from pads to corresponding vias on a substrate by computation comprises:

first intersection resolving means 11 that performs a first intersection resolving process for all intersections formed between tentative traces connecting between the pads and the corresponding vias by straight lines sequentially from the intersection nearest to the pads, wherein the first intersection resolving process determines distances from an intersection formed between the two tentative traces to vias, with which the two tentative traces are connected, respectively, and allows one of the two tentative traces associated with the longer distance to bypass the via, with which the other of the two tentative traces associated with the shorter distance is connected, so that the intersection can be resolved, and defines this bypass trace as an interim trace; and second intersection resolving means 12 that, after the first intersection resolving process is completed by the first intersection resolving means 11, performs a second intersection resolving process for all intersections formed between the interim traces themselves and intersections formed between the interim and tentative traces sequentially from the intersection nearest to the pads, wherein the second intersection resolving process determines distances from an intersection formed between the two interim traces themselves or an intersection formed between the interim trace and the tentative trace to the vias, with which the two interim or tentative traces are connected, respectively, and allows one of the two interim or tentative traces associated with the longer distance to bypass the via, with which the other of the two interim or tentative traces associated with the shorter distance is connected, so that the intersection can be resolved, and defines this bypass trace as a new interim trace. Then, when all the intersections have been resolved by said second intersection resolving process by the second intersection resolving means 12, said tentative and/or interim traces are defined as said optimal traces.

The first intersection resolving means 11 has first determination means 21 that determines whether the interim trace generated when the tentative trace associated with the longer distance is allowed to bypass the via can secure clearances between the interim trace, the via and formed elements adjacent to the via, or not. When the first determination means 21 determines that the interim trace as it is cannot secure said clearances, in place of such interim trace, the first intersection resolving means 11 allows the tentative trace associated with the shorter distance to bypass the via, with which the tentative trace associated with the longer distance is connected, and redefines this bypass trace as a new interim trace.

The first intersection resolving means 11 has: counting means 22 that counts the number of intersections between the tentative trace that is associated with the shorter distance and that is connected with the via which the trace is allowed to bypass and other tentative traces; and second determination means 23 that determines, based on the number of intersections counted by the counting means 22, whether the interim trace generated when the tentative trace associated with the longer distance is allowed to bypass the via can secure the clearances between the interim trace, the via and formed elements adjacent to the via or not. When the second determination means 23 determines that the interim trace as it is cannot secure the clearances, in place of such interim trace, the first intersection resolving means 11 allows the tentative trace associated with the shorter distance to bypass the via, with which the tentative trace associated with the longer distance is connected, and redefines this bypass trace as a new interim trace.

Here, the first intersection resolving means 11, the second intersection resolving means 12, the first determination means 21, the counting means 22 and the second determination means 23 in the automatic trace determination apparatus 1 are implemented by a computer program in the form of software that can be operated by an arithmetic processing unit such as a computer. An apparatus for performing the above-mentioned processes and a computer program for allowing the computer to perform the above-mentioned processes can be implemented by those skilled in the art who understand the following description. Further, it will be evident to those skilled in the art that the computer program for allowing the computer to perform the above-mentioned processes may be stored in storage media.

BRIEF DESCRIPTION OF THE DRAWINGS

The present invention will be more clearly understood from the description as set below with reference to the accompanying drawings, wherein:

FIG. 37 is a diagram for describing legends of symbols for vias, pads and nets to be wired that are indicated in the figures attached to this specification;

FIG. 38 is a diagram illustrating a trace design result in which the intersections between the nets shown in FIG. 36 are resolved by using a technique as set forth in Japanese Unexamined Patent Publication No. 2002-083006;

DESCRIPTION OF THE PREFERRED EMBODIMENTS

Figure 1:
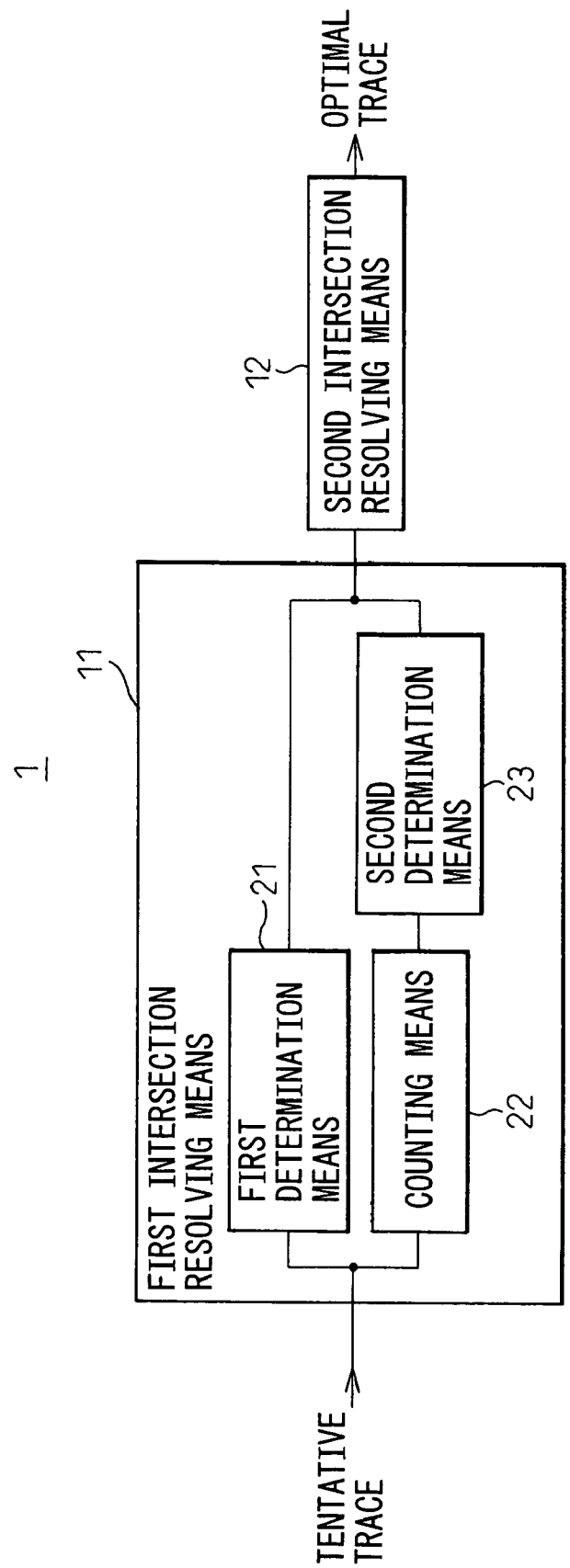
FIG. 1 is a principle block diagram of an automatic trace determination apparatus according to the present invention.
Figure 2:
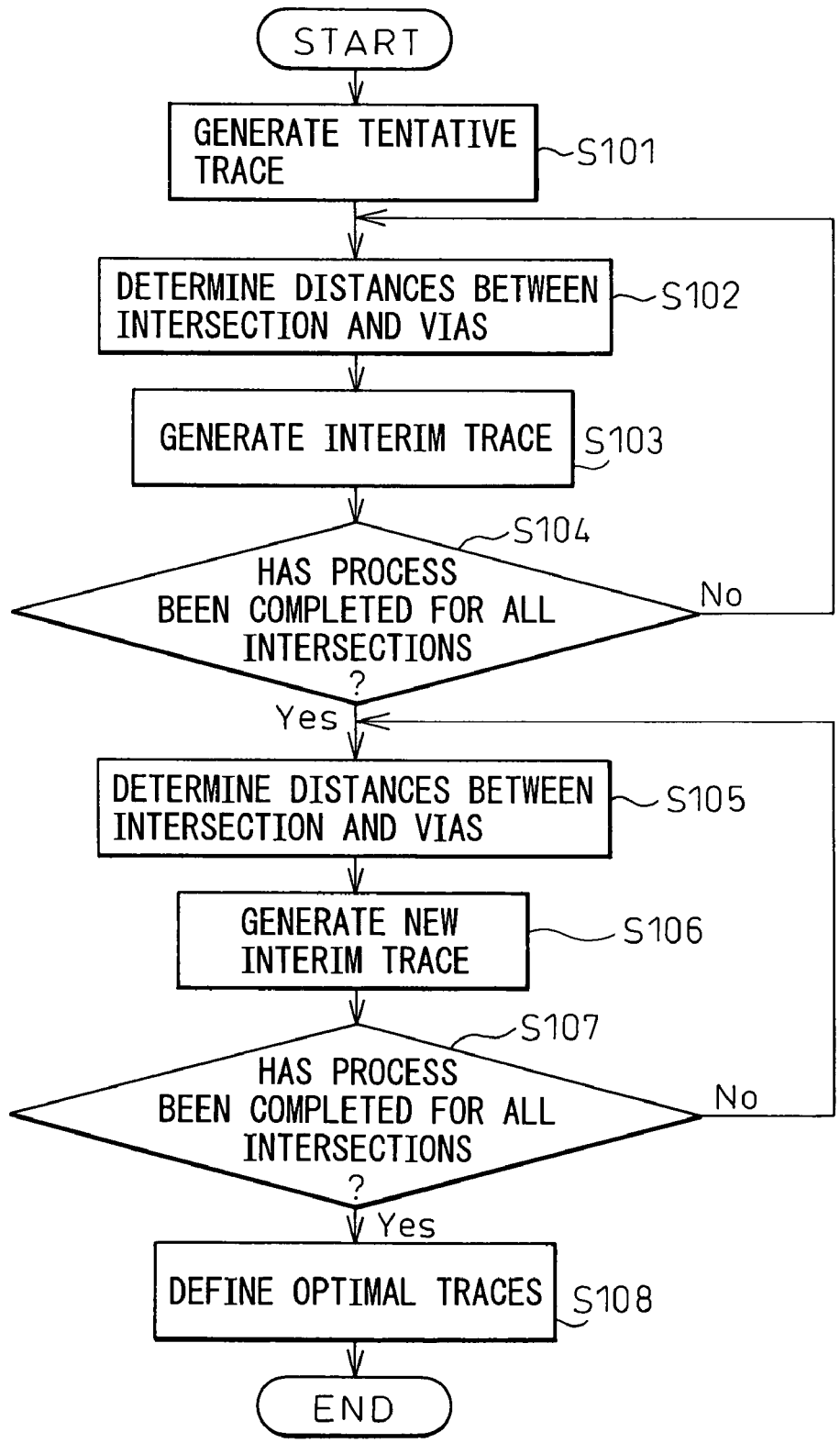
FIG. 2 is a flow chart showing an operational flow of an automatic trace determination method according to an embodiment of the present invention.

FIG. 2 is a flow chart showing an operational flow of an automatic trace determination method according to an embodiment of the present invention.

First, in step S101, pads disposed on a substrate and vias connected with the respective pads are assumed on a virtual plane and, then, on such virtual plane, the pads are connected with the respective vias by straight lines (rats), which are defined as tentative traces.

Next, in step S102, distances from an intersection formed by two of the tentative traces generated in step S101 to the vias, with which the two tentative traces are connected, respectively, are determined. Here, of course, there may be a tentative trace that does not intersect with any other tentative traces and, in such a case, this process is not performed.

Next, in step S103, one tentative trace associated with the longer tentative trace is allowed to bypass the other via, with which the tentative trace associated with the shorter distance is connected, so that the intersection can be resolved and, then, this bypass trace is defined as an interim trace.

In this specification, the processes in the above-mentioned steps S102 and S103 are collectively referred to as the "first intersection resolving process". This first intersection resolving process is performed for all intersections formed between the tentative traces sequentially from the intersection nearest to the pads. As a result, in step S104, it is determined whether the first intersection resolving process has been completed or not for all the intersections formed between the tentative traces.

Once the first intersection resolving process has been completed, all the intersections between the tentative traces are resolved and all the tentative traces that have intersected with other tentative traces are replaced with the interim traces. On the other hand, the tentative traces that do not intersect with any other tentative traces are not replaced with the interim traces and remain as the tentative traces. In other words, the tentative traces that exist when the first intersection resolving process has been completed do not intersect with any other tentative traces and they are not replaced with the interim traces.

The interim traces generated by the first intersection resolving process described above either may intersect with the other interim traces generated similarly, may intersect with the tentative traces that are independent of the first intersection resolving process, or may not intersect with any other interim and tentative traces. The processes in the next steps S105-S107 are intended to resolve the intersections between the interim traces themselves and the intersections between the interim traces and the tentative traces and, thus, to resolve all possible intersections.

After the first intersection resolving process has been completed, in the next step S105, distances from the intersections between the interim traces themselves or intersections between the interim and tentative traces to the vias, with which the respective interim or tentative traces are connected, respectively, are determined.

Next, in step S105, one interim or tentative trace associated with the longer distance between the intersection and the one via is allowed to bypass the other via, to which the shorter interim or tentative trace is connected, so that the intersection can be resolved and this bypass trace is defined as a new interim trace.

In this specification, the processes in the steps S105 and S106 are collectively referred to as the "second intersection resolving process". This second intersection resolving process is performed for all intersections formed between the interim traces themselves and intersections formed between the interim and tentative traces sequentially from the intersection nearest to the pads. As a result, in step S107, it is determined whether the second intersection resolving process has been completed or not for all the intersections formed between the interim traces themselves and the intersections formed between the interim traces and the tentative traces.

Once the second intersection resolving process has been completed, all the intersections formed between the interim traces themselves and the intersections formed between the interim and tentative traces are resolved. In other words, the tentative or interim traces that exist when the second intersection resolving process has been completed have no intersection with the other tentative or interim traces and, therefore, in step S108, these traces are defined as optimal traces.

The process of the steps S101-S108 in the automatic trace determination process according to an embodiment of the present invention are performed by a processor such as a computer. In this connection, before performing the step S101, it is desirable that various data about design data, rules for clearances, coordinates, shapes, sizes and orientations of the pads, coordinates, shapes, sizes and orientations of the vias, substrate information, as well as traces from chip pads of a semiconductor chip to corresponding pads and the like is input to the processor in advance. The above-mentioned processor uses the above-mentioned input data to start the process from the step S101. Through the steps S101-S108, the optimal trace positions from the pads to the respective vias on the substrate are determined automatically by computation.

Figure 3A:
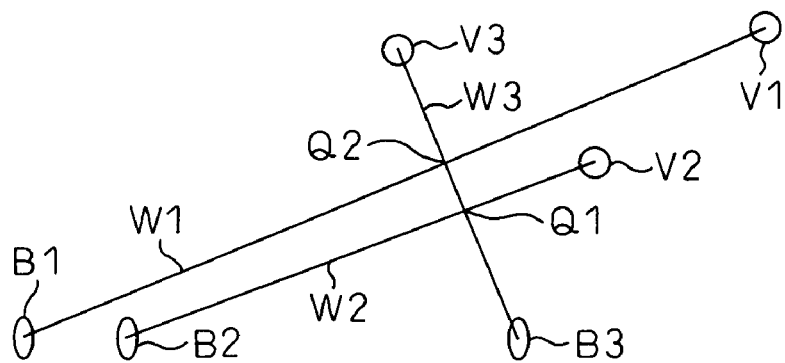
FIGS. 3A-3C are diagrams for describing a first specific example of optimal traces generated by an automatic trace determination apparatus according to an embodiment of the present invention.
Figure 3B:
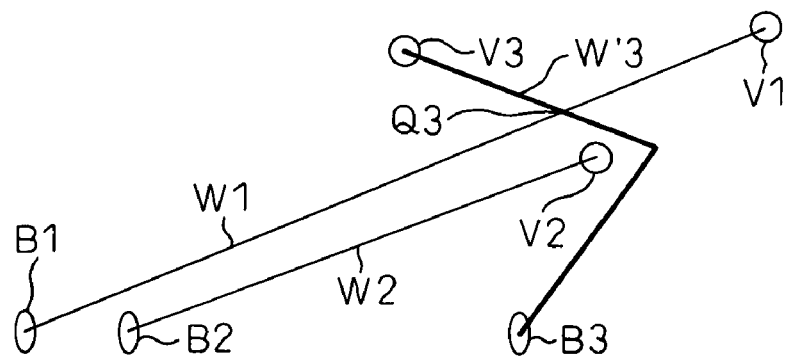
Figure 3C:
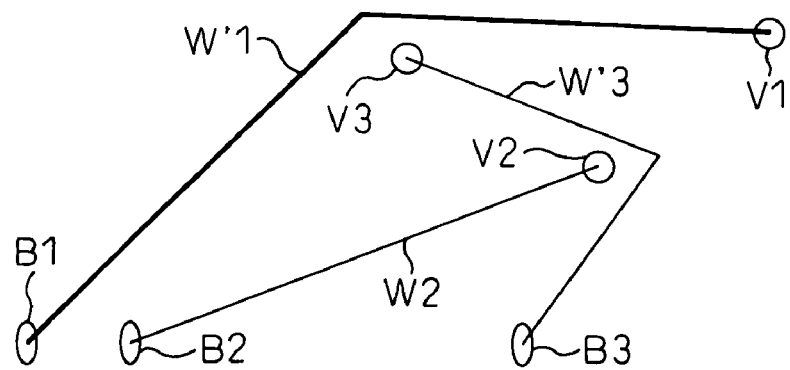

FIGS. 3A-3C are diagrams for describing a first specific example of optimal traces generated by an automatic trace determination apparatus according to an embodiment of the present invention.

Here, as an example, as shown in FIG. 3A, it is assumed that a tentative trace W3 connecting between a pad B3 and a via V3 intersects (crosses) with a tentative trace W1 connecting between a pad B1 and a via V1 and a tentative trace W2 connecting between a pad B2 and a via V2 at intersections Q1 and Q2, respectively. In this specific example, in particular, it is assumed that the tentative trace W1 is longer than the tentative trace W2.

The first intersection resolving process is performed for all intersections formed between the tentative traces sequentially from the intersection nearest to the pads. In the example shown in FIG. 3A, the intersection Q1 is nearer to the pads B1, B2 and B3 than the intersection Q2 and, therefore, the first intersection resolving process is performed first for the intersection Q1 and, then, for the intersection Q2.

The first intersection resolving process is performed for the intersection Q1 as follows. In FIG. 3A, distances Q1V2 and Q1V3 from the intersection Q1 formed between the tentative traces W2 and W3 to the vias V2 and V3, with which the tentative traces W2 and W3 are connected, respectively, are determined. In the example shown in FIG. 3A, the distance Q1V3 between the intersection Q1 and the via V3 is longer than the distance Q1V2 between the intersection Q1 and the via V2. Therefore, the tentative trace W3 associated with the longer distance Q1V3 is allowed to bypass the via V2, with which the tentative trace W1 associated with the shorter distance Q1V2 is connected, so that the intersection Q1 can be resolved. The trace obtained at this time is defined as an interim trace W'3. Thus, as a result of the first intersection resolving process, the tentative trace W3 connecting between the pad B3 and the via V3 shown in FIG. 3A is replaced with the interim trace W'3 connecting between the pad B3 and the via V3 shown in FIG. 3B.

In the state of FIG. 3B, all the intersections formed between the tentative traces are resolved. Therefore, at this stage, the first intersection resolving process is completed and the second intersection resolving process is started. As shown in FIG. 3B, the interim trace W'3 intersects with the tentative trace W1 at an intersection Q3. Therefore, distances Q3V3 and Q3V1 from the intersection Q3 formed between the interim trace W'3 and the tentative trace W1 to the vias V3 and V1, with which the interim trace W'3 and the tentative trace W1 are connected, respectively, are determined. In the example shown in FIG. 3B, the distance Q3V1 between the intersection Q3 and the via V1 is longer than the distance Q3V3 between the intersection Q3 and the via V3. Therefore, the tentative trace W1 associated with the longer distance Q3V1 is allowed to bypass the via V3, with which the interim trace W'3 associated with the shorter distance Q3V3 is connected, so that the intersection Q3 can be resolved. The trace obtained at this time is defined as a new interim trace W'1. Thus, as a result of the second intersection resolving process, the tentative trace W1 connecting between the pad B1 and the via V1 shown in FIG. 3B is replaced with the interim trace W'1 connecting between the pad B1 and the via V1 shown in FIG. 3C.

In the state of FIG. 3C, all the intersections formed between the tentative traces themselves, between the interim traces themselves, and between the tentative and interim traces are resolved. Therefore, at this stage, the second intersection resolving process is completed and the interim trace W'1, the tentative trace W2 and the interim trace W'3 are defined as optimal traces. Thus, retrograde traces as shown in FIG. 3C are generated.

FIGS. 4A-4C, 5A and 5B are diagrams for describing a second specific example of optimal traces generated by an automatic trace determination apparatus according to an embodiment of the present invention.

Figure 4A:
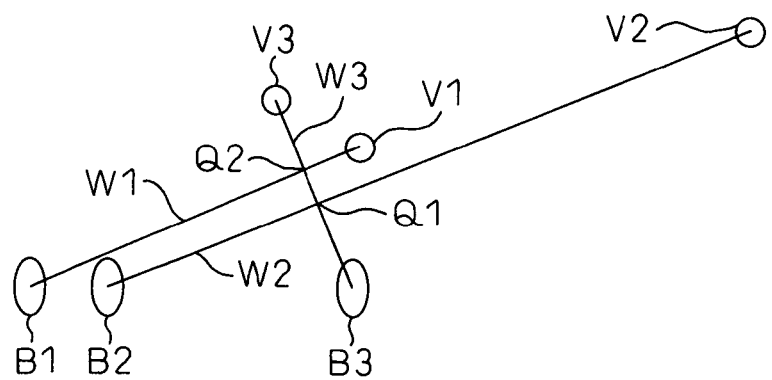
FIGS. 4A-4C, 5A and 5B are diagrams for describing a second specific example of optimal traces generated by an automatic trace determination apparatus according to an embodiment of the present invention.

Here, as an example, as shown in FIG. 4A, it is assumed that a tentative trace W3 connecting between a pad B3 and a via V3 intersects (crosses) with a tentative trace W1 connecting between a pad B1 and a via V1 and a tentative trace W2 connecting between a pad B2 and a via V2 at intersections Q1 and Q2, respectively. In this specific example, in particular, it is assumed that the tentative trace W2 is longer than the tentative trace W1.

In the example shown in FIG. 4A, the intersection Q1 is nearer to the pads B1, B2 and B3 than the intersection Q2 and, therefore, the first intersection resolving process is performed first for the intersection Q1 and, then, for the intersection Q2.

First, the first intersection resolving process is performed for the intersection Q1 as follows. In FIG. 4A, distances Q1V2 and Q1V3 from the intersection Q1 formed between the tentative traces W2 and W3 to the vias V2 and V3, with which the tentative traces W2 and W3 are connected, respectively, are determined. In the example shown in FIG. 4A, the distance Q1V2 between the intersection Q1 and the via V2 is longer than the distance Q1V3 between the intersection Q1 and the via V3. Therefore, the tentative trace W2 associated with the longer distance Q1V2 is allowed to bypass the via V3, with which the tentative trace W3 associated with the shorter distance Q1V3 is connected, so that the intersection Q1 can be resolved. The trace obtained at this time is defined as an interim trace W'2. Thus, as a result of the first intersection resolving process, the tentative trace W2 connecting between the pad B2 and the via V2 shown in FIG. 4A is replaced with the interim trace W'2 connecting between the pad B2 and the via V2 shown in FIG. 4B.

Figure 4B:
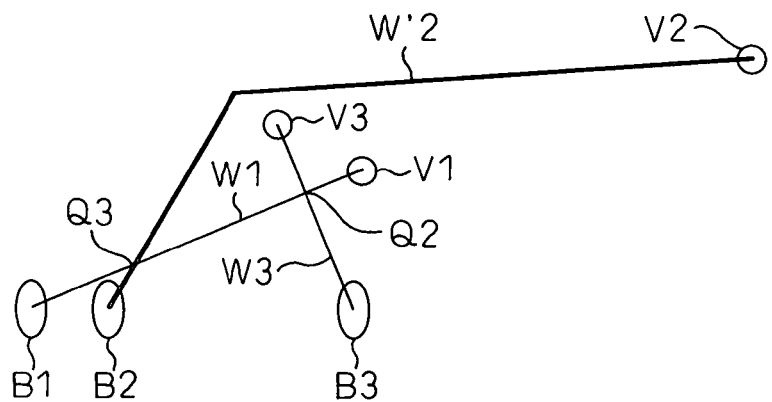

Next, the first intersection resolving process is performed for the intersection Q2 as follows. In FIG. 4B, distances Q2V1 and Q2V3 from the intersection Q2 formed between the tentative traces W1 and W3 to the vias V1 and V3, with which the tentative traces W1 and W3 are connected, respectively, are determined. In the example shown in FIG. 4B, the distance Q2V3 between the intersection Q2 and the via V3 is longer than the distance Q2V1 between the intersection Q2 and the via V1. Therefore, the tentative trace W3 associated with the longer distance Q2V3 is allowed to bypass the via V1, with which the tentative trace W1 associated with the shorter distance Q2V1 is connected, so that the intersection Q2 can be resolved. The trace obtained at this time is defined as an interim trace W'3. Thus, as a result of the first intersection resolving process, the tentative trace W3 connecting between the pad B3 and the via V3 shown in FIG. 4B is replaced with the interim trace W'3 connecting between the pad B3 and the via V3 shown in FIG. 4C.

Figure 4C:
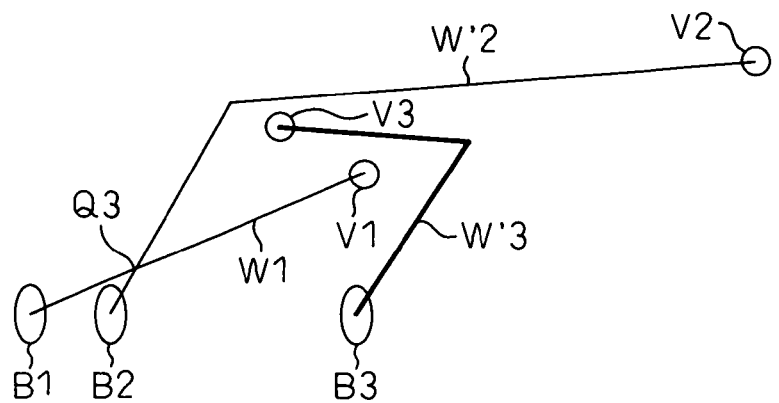

In the state of FIG. 4C, all the intersections formed between the tentative traces are resolved. Therefore, at this stage, the first intersection resolving process is completed and the second intersection resolving process is started.

The interim trace W'2 shown in FIG. 4C intersects with the tentative trace W1 at an intersection Q3. Therefore, distances Q3V2 and Q3V1 from the intersection Q3 formed between the interim trace W'2 and the tentative trace W1 to the vias V2 and V1, with which the interim trace W'2 and the tentative trace W1 are connected, respectively, are determined. In the example shown in FIG. 4C, the distance Q3V2 between the intersection Q3 and the via V2 is longer than the distance Q3V1 between the intersection Q3 and the via V1. Therefore, the interim trace W'2 associated with the longer distance Q3V2 is allowed to bypass the via V1, with which the tentative trace W1 associated with the shorter distance Q3V1 is connected, so that the intersection Q3 can be resolved. The trace obtained at this time is defined as a new interim trace W''2. Thus, as a result of the second intersection resolving process, the interim trace W'2 connecting between the pad B2 and the via V2 shown in FIG. 4C is replaced with the interim trace W''2 connecting between the pad B2 and the via V2 shown in FIG. 5A.

Figure 5A:
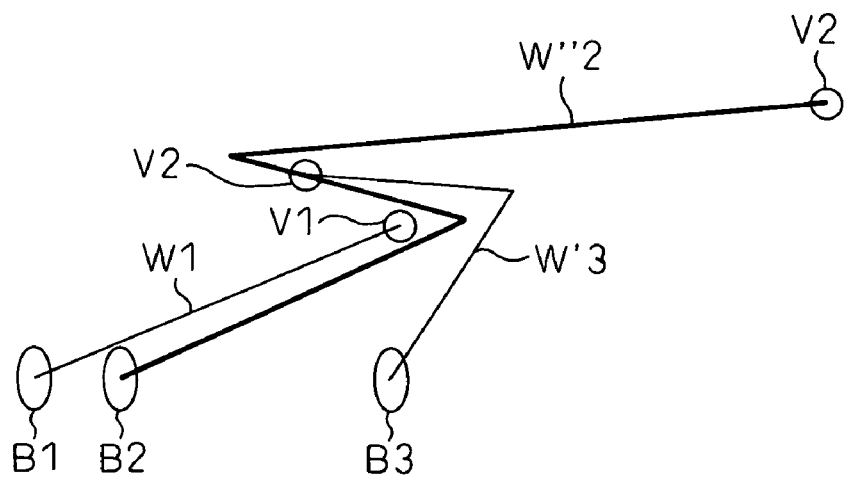
Figure 5B:
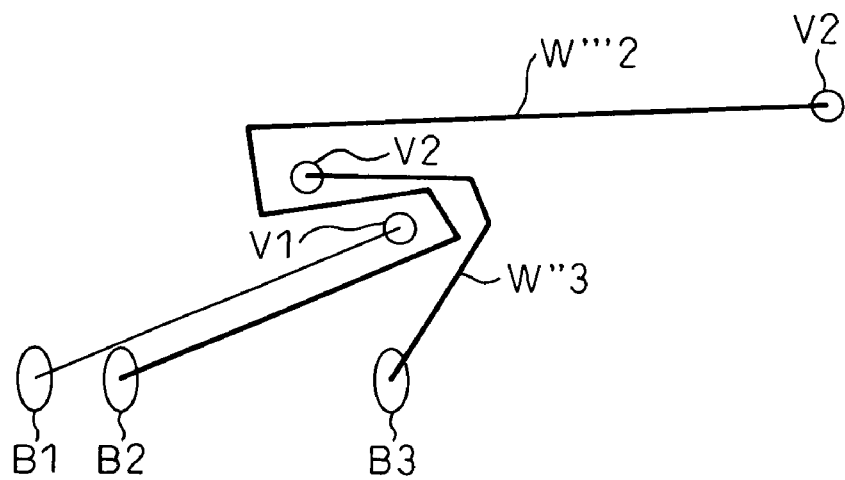

In the state of FIG. 5A, all the intersections formed between the tentative traces themselves, between the interim traces themselves, and between the tentative and interim traces are resolved. Therefore, at this stage, the second intersection resolving process is completed and the tentative trace W1, the interim trace W'2 and the interim trace W'3 are defined as optimal traces. Here, in the state of FIG. 5A, if clearances between the interim trace W'2 and each of the adjacent vias V1 and V2 and the interim trace W'3 are not secured sufficiently, as shown in FIG. 5B, the interim trace W''2 may be transformed into an interim trace W'''2 and the interim trace W'3 may be transformed into a trace W''3 and these traces may be defined as optimal traces. Thus, retrograde traces as shown in FIG. 5A or 5B are generated.

FIGS. 6-14 are diagrams for describing a third specific example of optimal traces generated by an automatic trace determination apparatus according to an embodiment of the present invention.

Figure 6:
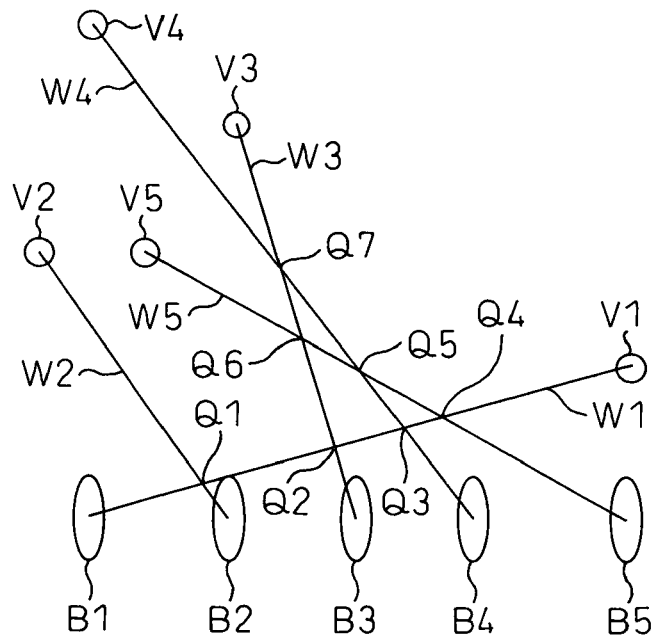
FIGS. 6-14 are a diagrams for describing a third specific example of optimal traces generated by an automatic trace determination apparatus according to an embodiment of the present invention.

Here, as an example, as shown in FIG. 6, tentative traces W1-W5 intersect (cross) with each other at intersections Q1-Q7.

In the example shown in FIG. 6, the intersections Q1, Q2, Q3, Q4, Q5, Q6 and Q7 are arranged from nearest to farthest to pads B1-B5 and, therefore, the first intersection resolving process is performed first for the intersection Q1.

The first intersection resolving process is performed for the intersection Q1 as follows. In FIG. 6, distances Q1V1 and Q1V2 from the intersection Q1 formed between tentative traces W1 and W2 to vias V1 and V2, with which the tentative traces W1 and W2 are connected, respectively, are determined. In the example shown in FIG. 6, the distance Q1V1 between the intersection Q1 and the via V1 is longer than the distance Q1V2 between the intersection Q1 and the via V2. Therefore, the tentative trace W1 associated with the longer distance Q1V1 is allowed to bypass the via V2, with which the tentative trace W2 associated with the shorter distance Q1V2 is connected, so that the intersection Q1 can be resolved. The trace obtained at this time is defined as an interim trace W'1. Thus, as a result of the first intersection resolving process, the tentative trace W1 connecting between the pad B1 and the via V1 shown in FIG. 6 is replaced with the interim trace W'1 connecting between the pad B1 and the via V1 shown in FIG. 7. In this connection, the interim trace W'1 generated by performing the first intersection process for the intersection Q1 will intersect with tentative traces W4 and W3 at intersections Q8 and Q9, respectively. However, in the present invention, the intersections on the interim traces are resolved by the second intersection resolving process after all the intersections between the tentative traces themselves has been resolved by the first intersection resolving process and, therefore, the intersections Q8 and Q9 on the interim trace W'1 are not resolved at this stage.

Figure 7:
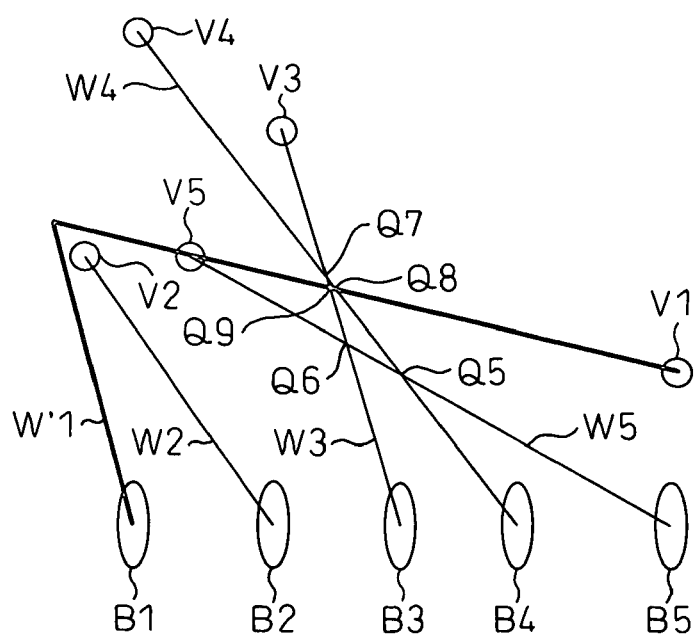

In FIG. 7, the next intersection subject to the first intersection resolving process is the intersection Q5 formed between the tentative traces W4 and W5. First, distances Q5V4 and Q5V5 from the intersection Q5 formed between the tentative traces W4 and W5 to vias V4 and V5, with which the tentative traces W4 and W5 are connected, respectively, are determined. In the example shown in FIG. 7, the distance Q5V4 between the intersection Q5 and the via V4 is longer than the distance Q5V5 between the intersection Q5 and the via V5. Therefore, the tentative trace W4 associated with the longer distance Q5V4 is allowed to bypass the via V5, with which the tentative trace W5 associated with the shorter distance Q5V5 is connected, so that the intersection Q5 can be resolved. The trace obtained at this time is defined as an interim trace W'4. Thus, as a result of the first intersection resolving process, the tentative trace W4 connecting between the pad B4 and the via V4 shown in FIG. 7 is replaced with the interim trace W'4 connecting between the pad B4 and the via V4 shown in FIG. 8.

Figure 8:
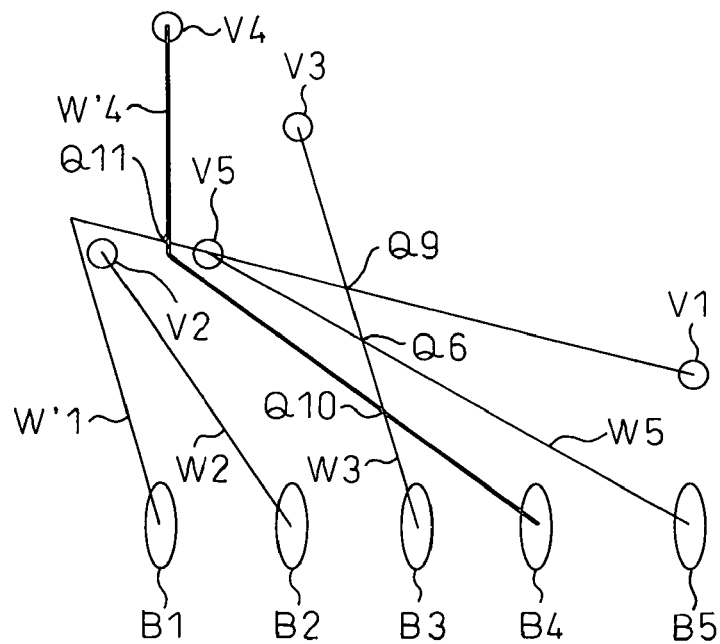

In FIG. 8, the next intersection subject to the first intersection resolving process is the intersection Q6 formed between the tentative traces W3 and W5. First, distances Q6V3 and Q6V5 from the intersection Q6 formed between the tentative traces W3 and W5 to the vias V3 and V5, with which the tentative traces W3 and W5 are connected, respectively, are determined. In the example shown in FIG. 8, the distance Q6V3 between the intersection Q6 and the via V3 is longer than the distance Q6V5 between the intersection Q6 and the via V5. Therefore, the tentative trace W3 associated with the longer distance Q6V3 is allowed to bypass the via V5, with which the tentative trace associated with the shorter distance Q6V5 is connected, so that the intersection Q6 can be resolved. The trace obtained at this time is defined as an interim trace W'3. Thus, as a result of the first intersection resolving process, the tentative trace W3 connecting between the pad B3 and the via V3 shown in FIG. 8 is replaced with the interim trace W'3 connecting between the pad B3 and the via V3 shown in FIG. 9.

Figure 9:
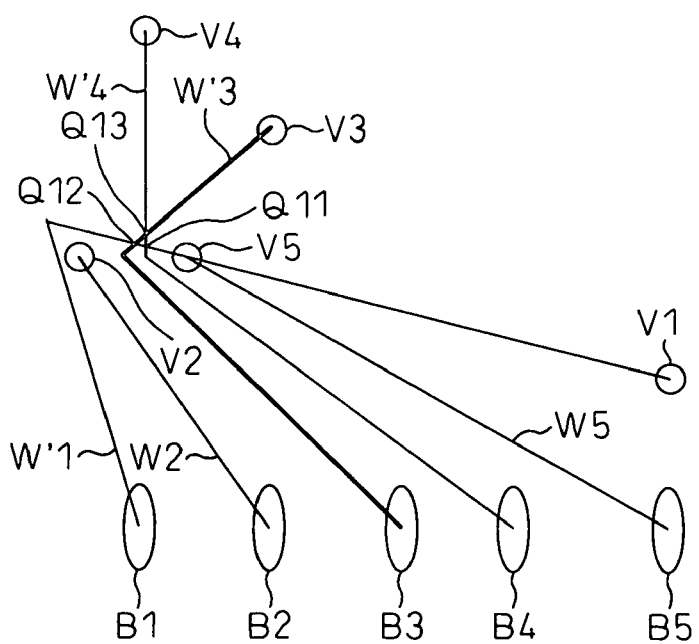

In the state of FIG. 9, all the intersections formed between the tentative traces are resolved. Therefore, at this stage, the first intersection resolving process is completed and the second intersection resolving process is started. Here, a clearance between the interim trace W'1 having an intersection Q11 and the via V5 is not secured and, therefore, the interim trace W'1 is replaced with the interim trace W"1 as shown in FIG. 10 and, then, the second intersection resolving process is performed.

Figure 10:
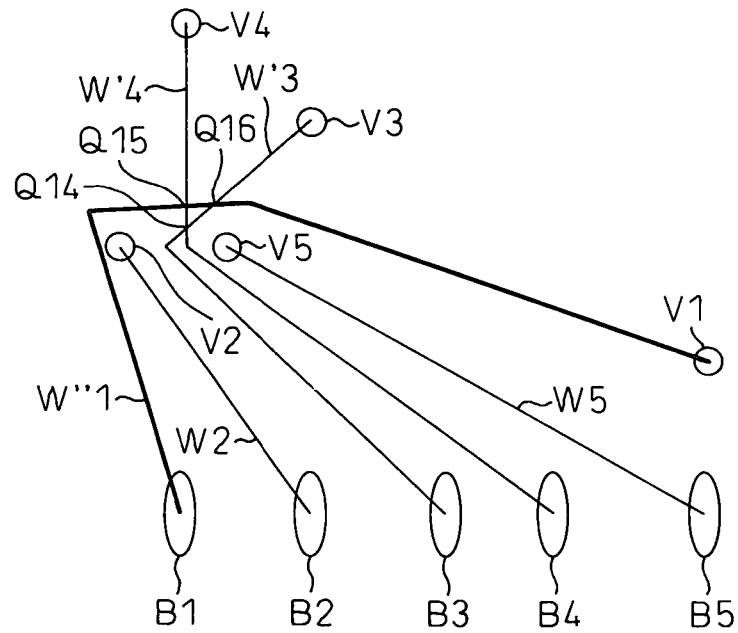

In the example shown in FIG. 10, intersections Q14, Q15 and Q16 are arranged from nearest to farthest to the pads B1-B5 and, therefore, the second intersection resolving process is performed first for the intersection Q14.

The second intersection resolving process is performed for the intersection Q14 as follows. In FIG. 10, the interim trace W'3 intersects with the interim trace W'4 at Q14. Therefore, distances Q14V3 and Q14V4 from the intersection Q14 formed between the tentative traces W'3 and W'4 to the vias V3 and V4, with which the interim traces W'3 and W'4 are connected, respectively, are determined. In the example shown in FIG. 10, the distance Q14V4 between the intersection Q14 and the via V4 is longer than the distance Q14V3 between the intersection Q14 and the via V3. Therefore, the interim trace W'4 associated with the longer distance Q14V4 is allowed to bypass the via V3, with which the interim trace W'3 associated with the shorter distance Q14V3 is connected, so that the intersection Q14 can be resolved. The trace obtained at this time is defined as a new interim trace W"4. Thus, as a result of the second intersection resolving process, the interim trace W'4 connecting between the pads B4 and the via V4 shown in FIG. 10 is replaced with the interim trace W"4 connecting between the pad B4 and the via V4 shown in FIG. 11.

Figure 11:
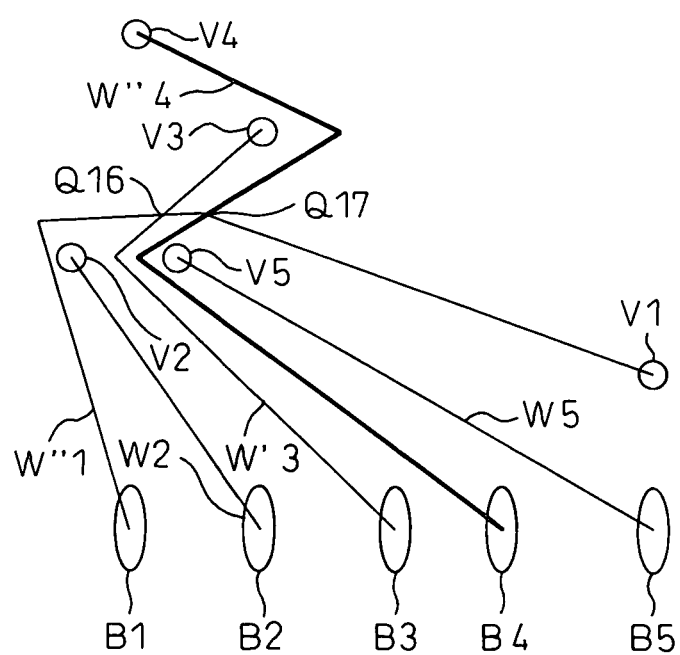

In the state of FIG. 11, the intersections Q16 and Q17 are arranged from nearest to farthest to the pads B1-B5 and, therefore, the second intersection resolving process is performed first for the intersection Q16.

The second intersection resolving process is performed for the intersection Q16 as follows. In FIG. 11, the interim trace W"1 intersects with the interim trace W'3 at Q16. Therefore, distances Q16V1 and Q16V3 from the intersection Q16 formed between the interim traces W"1 and W'3 to the via V1 and V3, with which the interim traces W"1 and W'3 are connected, are determined. In the example shown in FIG. 11, the distance Q16V1 between the intersection Q16 and the via V1 is longer than the distance Q16V3 between the intersection Q16 and the via V3. Therefore, the interim trace W"1 associated with the longer distance Q16V1 is allowed to bypass the via V3, with which the interim trace W'3 associated with the shorter distance Q16V3 is connected, so that the intersection Q16 can be resolved. The trace obtained at this time is defined as a new interim trace W'''1. Thus, as a result of the second intersection resolving process, the interim trace W"1 connecting between the pad B1 and the via V1 shown in FIG. 11 is replaced with the interim trace W'''1 connecting between the pad B1 and the via V1 shown in FIG. 12.

Figure 12:
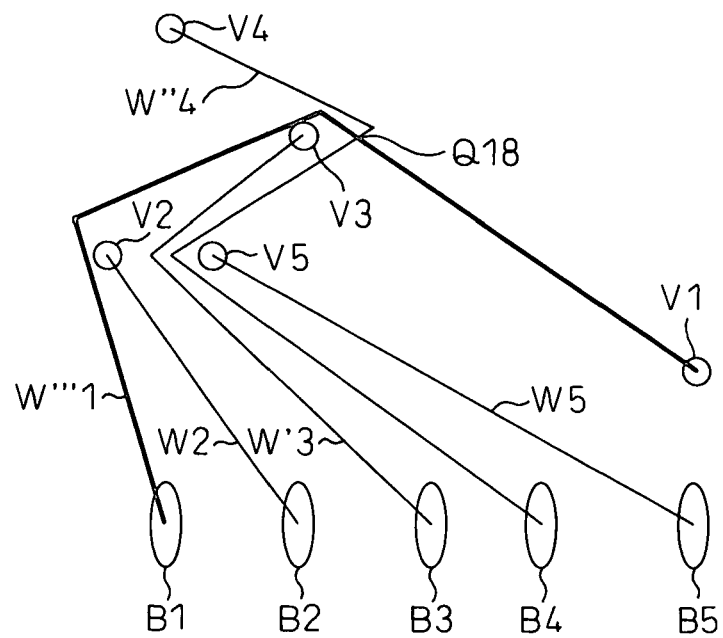

In the state of FIG. 12, there is only an intersection Q18 between the interim traces themselves. The second intersection resolving process is performed for the intersection Q18 as follows. In FIG. 12, the interim trace W'''1 intersects with the interim trace W'4 at Q18. Therefore, distances Q18V1 and Q18V4 from the intersection Q18 formed between the interim traces W'''1 and W'4 to the vias V1 and V4, with which the interim traces W'''1 and W'4 are connected, are determined. In the example shown in FIG. 12, the distance Q18V1 between the intersection Q18 and the via V1 is longer than the distance Q18V4 between the intersection Q18 and the via V4. Therefore, the interim trace W'''1 associated with the longer distance Q18V1 is allowed to bypass the via V4, with which the interim trace W'4 associated with the shorter distance Q18V4 is connected, so that the intersection Q18 can be resolved. The trace obtained at this time is defined as a new interim trace W6. Thus, as a result of the second intersection resolving process, the interim trace W'''1 connecting between the pad B1 and the via V1 shown in FIG. 12 is replaced with the interim trace W6 connecting the pad B1 and the via V1 shown in FIG. 13.

Figure 13:
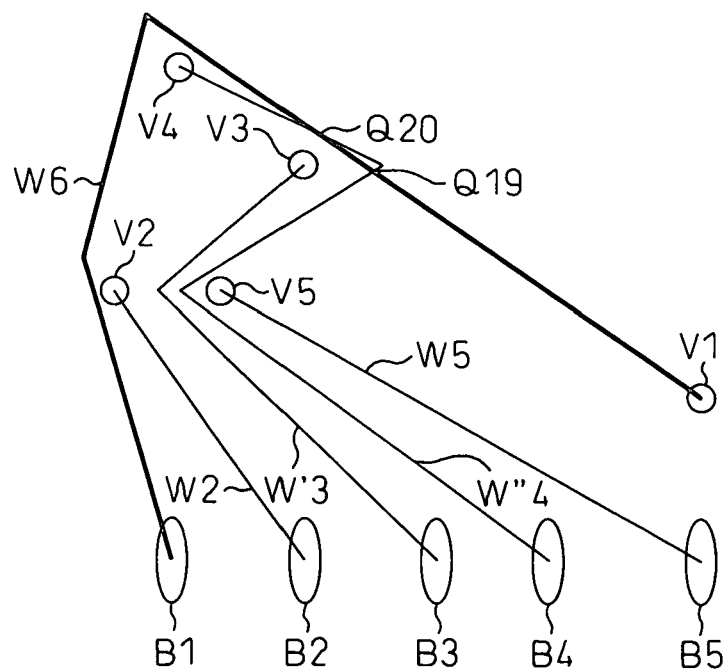

In the state of FIG. 13, intersections Q19 and Q20 are arranged from nearest to farthest to the pads B1-B5 and, therefore, the second intersection resolving process is performed first for the intersection Q19.

The second intersection resolving process is performed for the intersection Q19 as follows. In FIG. 13, the interim trace W6 intersects with the interim trace W"4 at Q19. Therefore, distances Q19V1 and Q19V4 from the intersection Q19 formed between the interim traces W6 and W"4 to the vias V1 and V4, with which the interim traces W6 and W"4 are connected, are determined. In the example shown in FIG. 13, the distance Q19V1 between the intersection Q19 and the via V1 is longer than the distance Q19V4 between the intersection Q19 and the via V4. Therefore, the interim trace W6 associated with the longer distance Q19V1 is allowed to bypass the via V4, with which the interim trace W"4 associated with the shorter distance Q19V4 is connected, so that the intersection Q19 can be resolved. The trace obtained at this time is defined as a new interim trace W'6. Thus, as a result of the second intersection resolving process, the interim trace W6 connecting between the pad B1 and the via V1 shown in FIG. 13 is replaced with the interim trace W'6 connecting between the pad B1 and the via V1 shown in FIG. 14.

Figure 14:
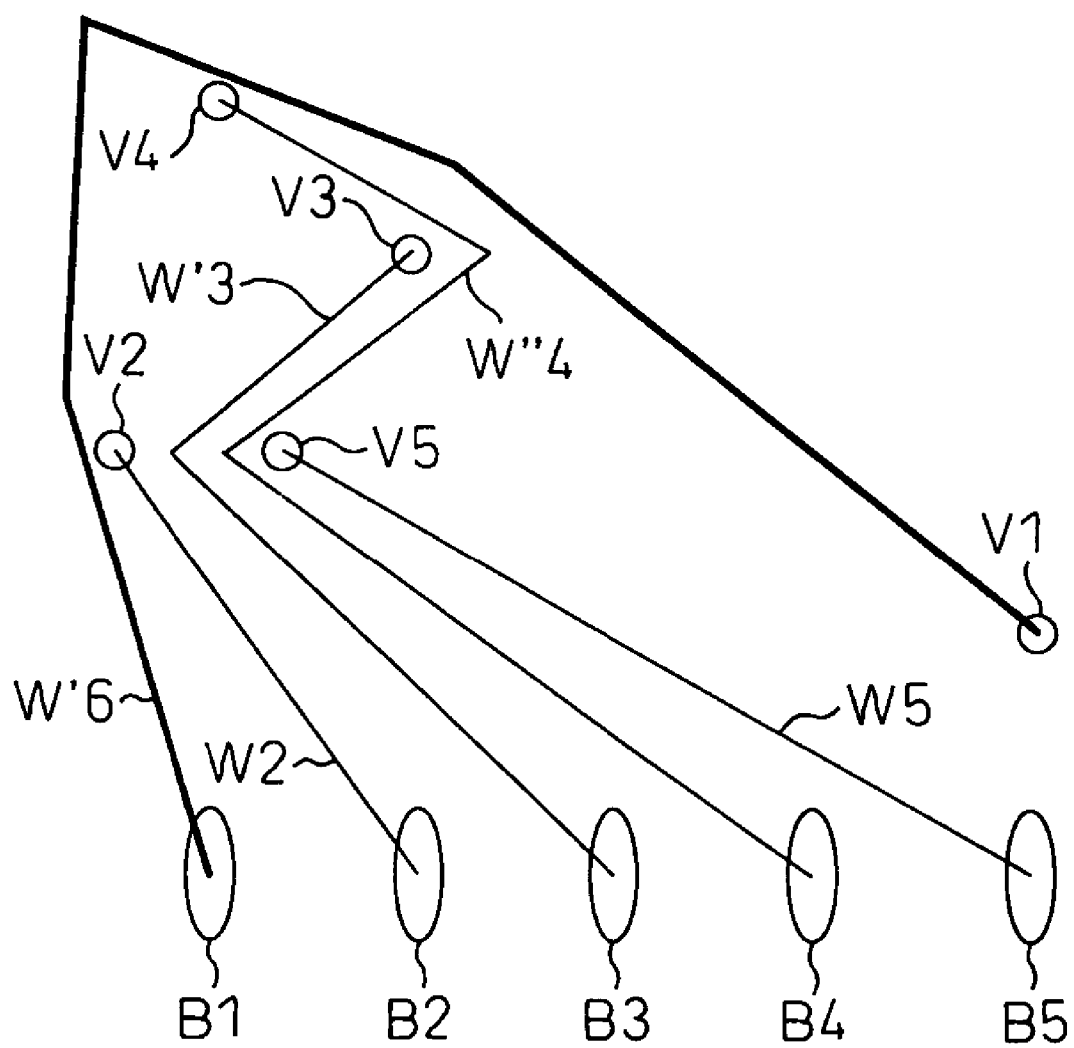

In the state of FIG. 14, all the intersections formed between the tentative traces themselves, between the interim traces themselves, and between the tentative and interim traces are resolved. Therefore, at this stage, the second intersection resolving process is completed and the interim trace W'6, the tentative trace W2, the interim trace W'3, the interim trace W'''4 and the tentative trace W5 are defined as optimal traces. Thus, retrograde traces as shown in FIG. 14 are generated.

Next, first to third variations of an embodiment of the present invention will be described.

Figure 15A:
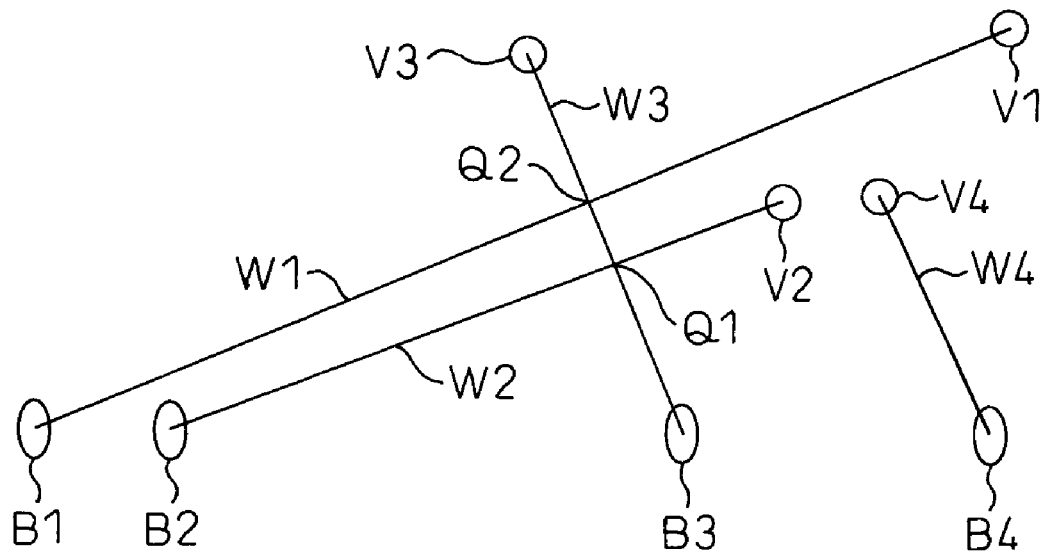
FIGS. 15A and 15B are diagrams for describing a case in which an interim trace that is generated by a first intersection resolving process cannot secure clearances sufficiently in an embodiment of the present invention.
Figure 15B:
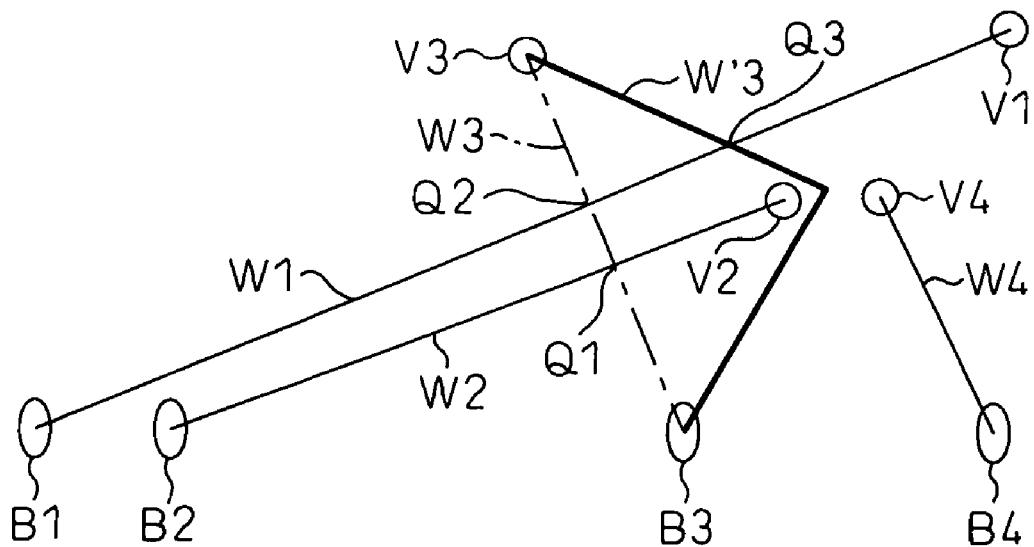

A first variation is intended to solve a problem that clearances cannot be secured sufficiently when an interim trace generated in the first intersection resolving process is disposed between a via to be bypassed and various formed elements such as other vias, gates, marks, pads or so on. FIGS. 15A and 15B are diagrams for describing a case in which an interim trace that is generated by the first intersection resolving process cannot secure clearances sufficiently in an embodiment of the present invention. Here, as an example, as shown in FIG. 15A, it is assumed that a tentative trace W3 intersects (crosses) with tentative traces W1 and W2 at intersections Q1 and Q2, respectively.

In the example shown in FIG. 15A, the intersections Q1 and Q2 are arranged from nearest to farthest to pads B1-B4 and, therefore, the first intersection resolving process is performed for the intersection Q1.

The first intersection resolving process is performed for the intersection Q1 as follows. In FIG. 15A, distances Q1V2 and Q1V3 from the intersection Q1 formed between the tentative traces W2 and W3 to the vias V2 and V3, with which the tentative traces W2 and W3 are connected, are determined. In this example, the distance Q1V3 is longer than the distance Q1V2 and, therefore, as shown in FIG. 15B, the tentative trace W3 associated with the longer distance Q1V3 is allowed to bypass the via V2, with which the tentative trace W2 associated with the shorter distance Q1V2 is connected, so that the intersection Q1 can be resolved and this trace is defined as an interim trace W'3. As a result, the interim trace W'3 is disposed between the vias V2 and V4. However, when a distance between the vias V2 and V4 is small, clearances cannot be secured sufficiently between the interim trace W'3 and the via V2 to be bypassed and the via V4 that is a formed element adjacent to the via V2.

Figure 16A:
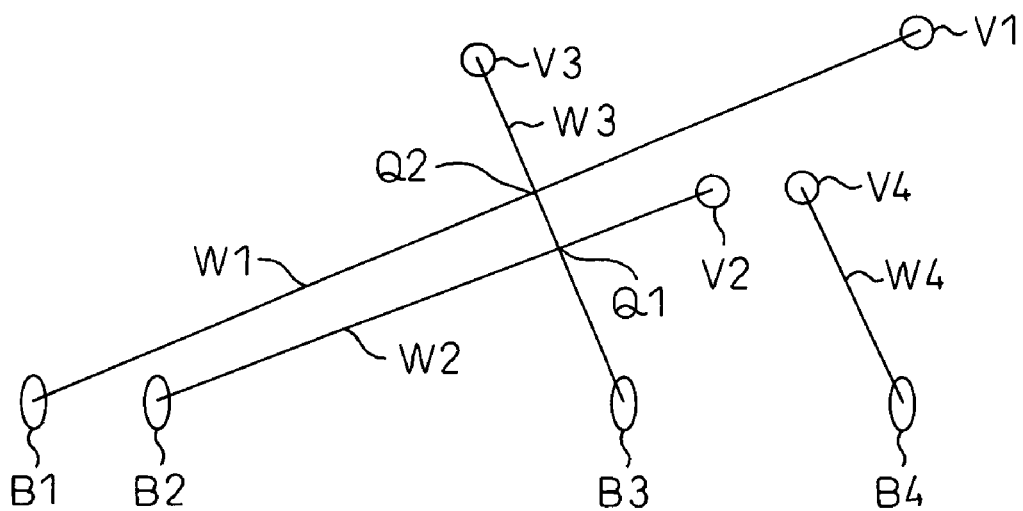
FIGS. 16A, 16B and 17 are diagrams for describing a first variation of an embodiment of the present invention.
Figure 16B:
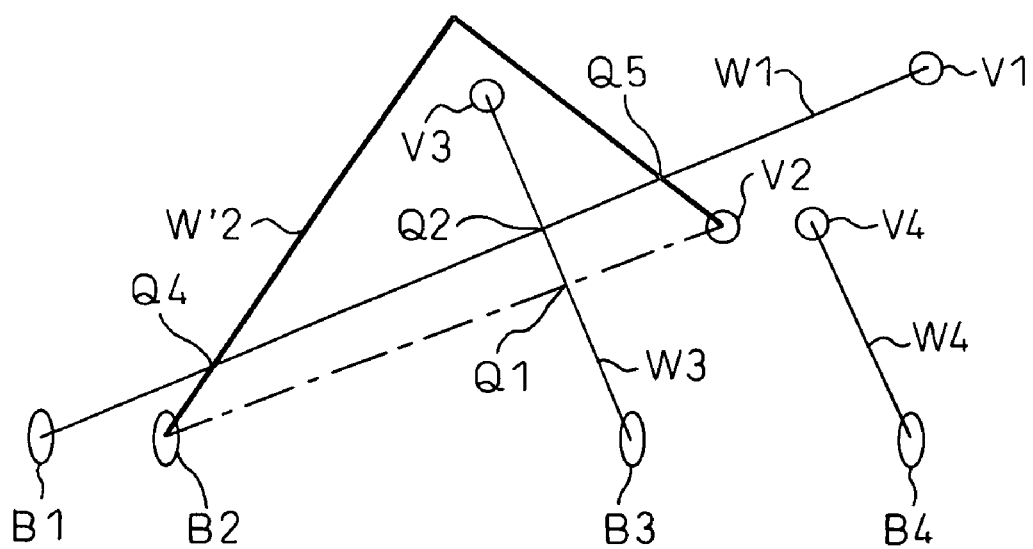
Figure 17:
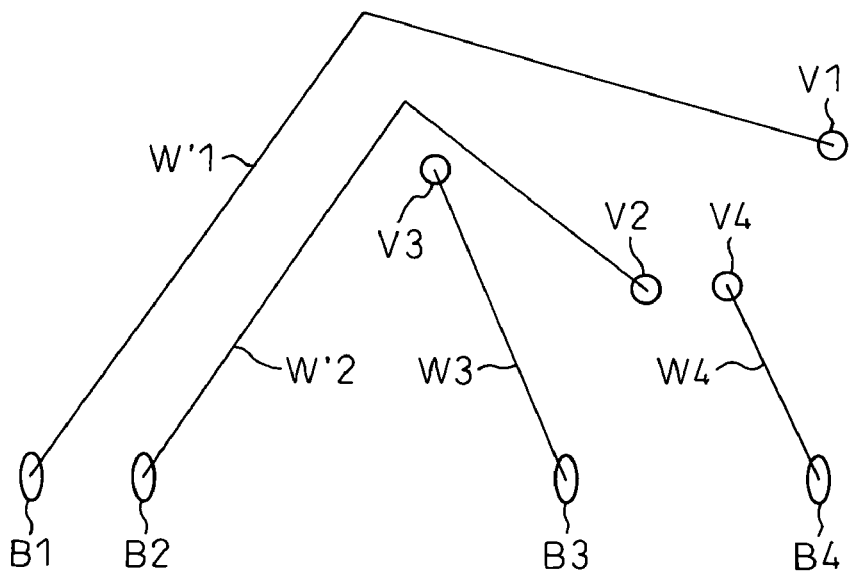

Therefore, in order to solve this problem, in the first variation, it is determined whether the interim trace generated by allowing the tentative trace associated with the longer distance to bypass the via can secure clearances between the interim trace, the via, and the formed elements adjacent to the via or not in the first intersection resolving process. At this time, if it is determined that this interim trace as it is cannot secure the clearances sufficiently, in place of this interim trace, the tentative trace associated with the shorter distance is allowed to bypass the via, with which the tentative trace associated with the longer distance is connected, and this is redefined as a new interim trace. FIGS. 16A, 16B and 17 are diagrams for describing the first variation of an embodiment of the present invention. Here, as an example, similarly to FIG. 15A and as shown in FIG. 16A, it is assumed that a tentative trace W3 intersects (crosses) with tentative traces W1 and W2 at intersections Q1 and Q2, respectively.

When it is determined whether an interim trace W'3 generated by allowing the tentative trace associated with the longer distance to bypass the via as shown in FIG. 15B can secure clearances between the interim trace and the vias V2 and V4 sufficiently or not, if it is determined that the interim trace W'3 cannot secure the clearances sufficiently, in place of the interim trace W'3, as shown in FIG. 16B, an tentative trace W2 associated with the shorter distance Q1V2 is allowed to bypass the via V3, with which the tentative trace W3 associated with the longer distance Q1V3 is connected, so that the intersection Q1 can be resolved and this trace is redefined as a new interim trace W'2. As a result, all the intersections formed between the tentative traces are resolved and, therefore, the first intersection resolving process is completed. After that, an intersection Q4 on the interim trace W'2 is resolved in the second intersection resolving process and, then, the interim traces W'1 and W'2 and the tentative traces W3 and W4 are defined as optimal traces.

Figure 18:
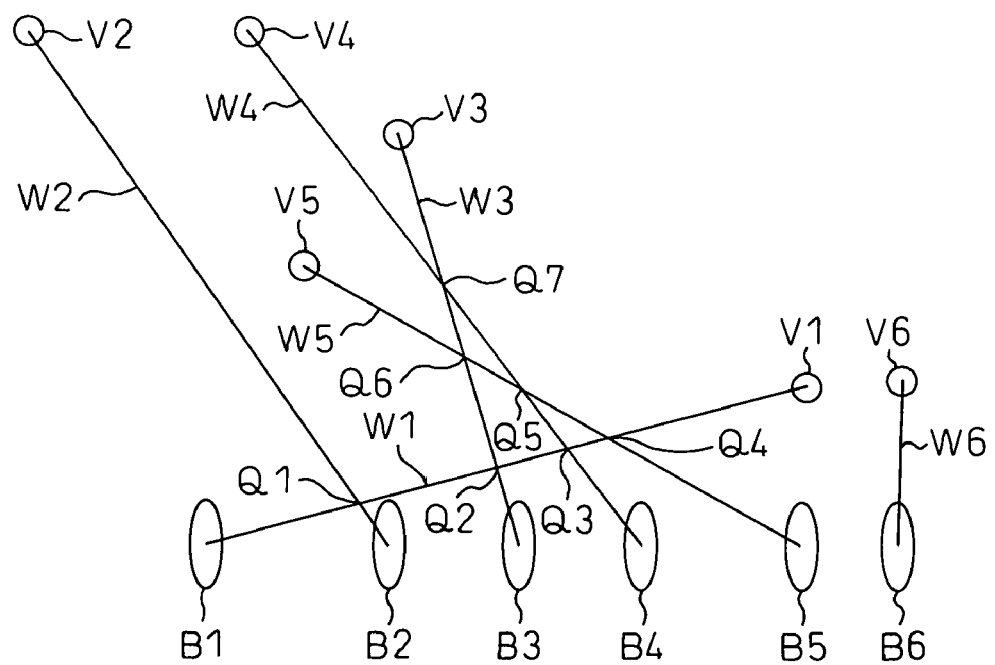
FIGS. 18-20 are diagrams for describing a second variation of an embodiment of the present invention.
Figure 19:
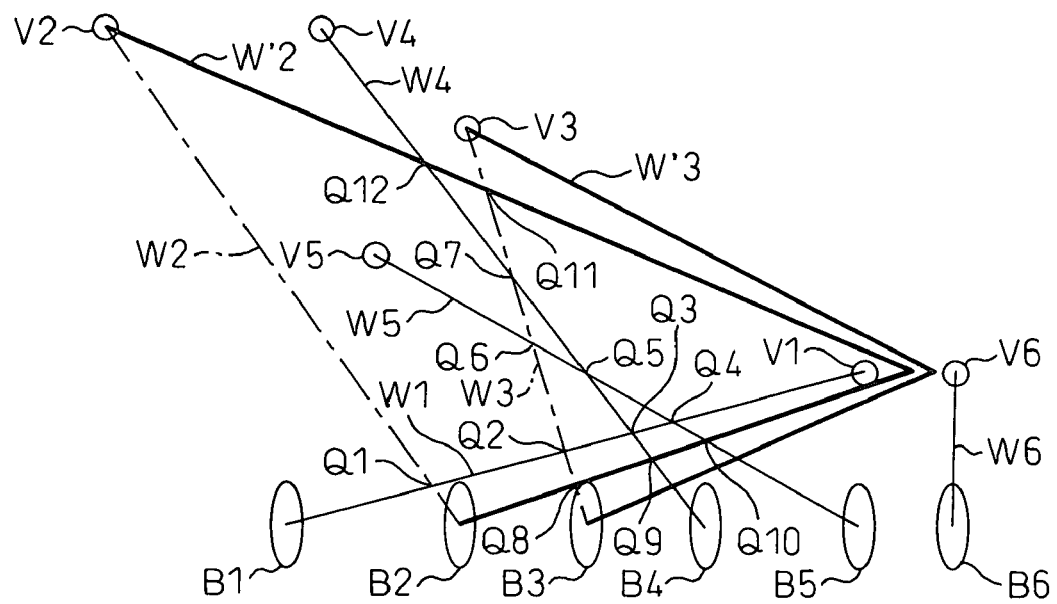
Figure 20:
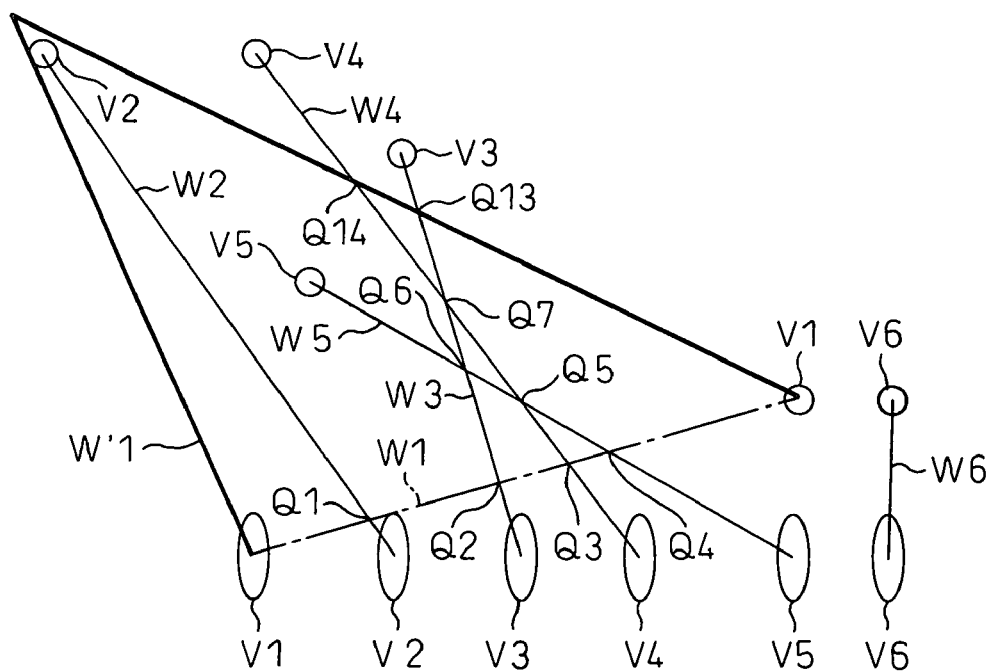

A second variation is intended to solve a problem that clearances cannot be secured sufficiently when a plurality of interim traces among those generated in the first intersection resolving process are disposed between a via to be bypassed and various formed elements such as other vias, gates, marks, pads or so on. FIGS. 18-20 are diagrams for describing the second variation in an embodiment of the present invention. Here, as an example, as shown in FIG. 18, it is assumed that tentative traces W1-W6 intersect (cross) with each other at intersections Q1-Q7.

In the example shown in FIG. 18, the intersections Q1, Q2, Q3, Q4, Q5, Q6 and Q7 are arranged from nearest to farthest to pads B1-B6. When the first intersection resolving process is performed for the intersection Q1 and Q2 in this order, interim traces W'2 and W'3 as shown in FIG. 19 are generated sequentially. At this time, the interim traces W'2 and W'3 are disposed between vias V1 and V6. However, a plurality of the interim traces are disposed between the vias V1 and V6 and, as a result, clearances between the via V1, the interim traces W'2 and W'3, and the via V6 cannot be secured. After this problem of the clearances has occurred due to the generation of the interim trace W'3 to resolve the intersection Q2, it is not efficient to perform the first intersection resolving process to resolve the intersection Q2 again. Therefore, in order to solve this problem, in the second variation, the number of intersections between the tentative trace associated with the shorter distance that is connected with the via to be bypassed and the tentative traces other than that is counted first in the first intersection resolving process. Then, based on the counted number of intersections, it is determined whether the interim trace generated by allowing the tentative trace associated with the longer distance to bypass the via can secure clearances between the interim trace, the via, and formed elements adjacent to the via or not. If it is determined that this interim trace as it is cannot secure the clearances based on the counted number, in place of the interim trace, the tentative trace associated with the shorter distance is allowed to bypass the via, with which the tentative trace associated with the longer distance is connected, and this trace is redefined as a new interim trace.

In the example shown in FIG. 18, the both interim traces W'2 and W'3 are generated to bypass the tentative trace W1. Therefore, the number of intersections between the tentative trace W1 and other tentative traces is counted. In the example shown in FIG. 18, the number of intersections on the tentative trace W1 is 4. A large number of the counted intersections means that a plurality of tentative traces will likely to bypass the tentative trace W1 in the first intersection resolving process. Therefore, if the number of the counted intersections is larger than a threshold, the tentative trace having the counted intersections itself is allowed to bypass. In the example shown in FIG. 19, the tentative trace W1 is allowed to bypass the via V2, with which the tentative trace W2 is connected, and this trace is defined as a new interim trace W'1 shown in FIG. 20. Subsequent processes are the same as those described above, the description of which will be omitted.

In the second variation, new interim traces are sought repeatedly till this problem of the clearances can be solved, but if this problem of the clearances cannot be solved even after that, the design concept itself may have a problem. In this case, for example, the arrangement of pads, vias and the like may be modified and, then, the design data itself may be regenerated again.

Figure 21:
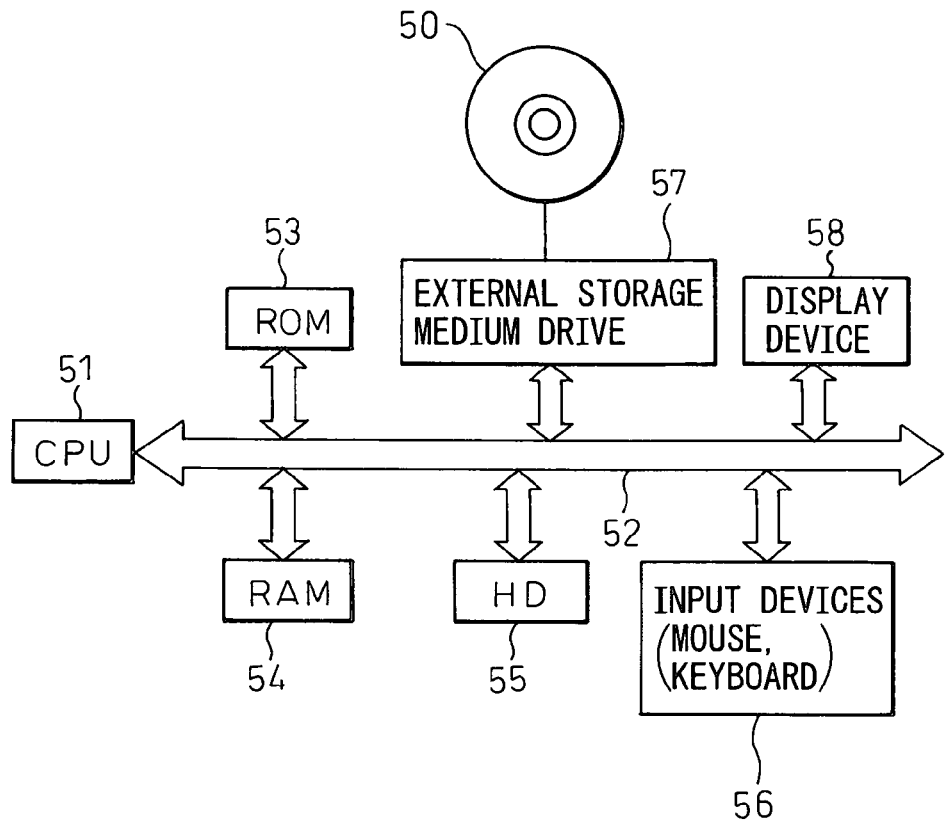
FIG. 21 is a block diagram showing a configuration of an automatic trace determination apparatus according to an embodiment of the present invention that operates according to a computer program that is stored on a storage medium for executing an automatic trace determination process.

The automatic trace determination apparatus according to this embodiment as described above is implemented by a processor such as a computer. FIG. 21 is a block diagram showing a configuration of an automatic trace determination apparatus according to an embodiment of the present invention that operates according to a computer program that is stored on a storage medium for executing an automatic trace determination process.

As shown in FIG. 21, a computer program run on the computer is stored on a storage medium (an external storage medium such as a flexible disk, a CD-ROM and the like) 50 and, as an example, it is installed in a computer configured as described below to operate as CAD equipment (an automatic trace determination apparatus).

A CPU 51 controls the automatic trace determination apparatus entirely. This CPU 51 is connected with a ROM 53, a RAM 54, a HD (hard disk drive) 55, an input device 56 such as a mouse, a keyboard and the like, an external storage medium drive 57, and a display device 58 such as a LCD, a CRT and the like through a bus 52. A control program for the CPU 51 is stored in the ROM 53.

A computer program for performing an automatic trace determination process according to an embodiment of the present invention (hereinafter simply referred to as the "automatic trace determination process program) is installed (stored) on the storage medium 50 on the HD 55. Further, in the RAM 54, a working area for the CPU 51 to perform the automatic trace determination process and an area for storing a portion of the automatic trace determination process program are secured. Moreover, in the HD 55, input data, final data and, further, an OS (operating system) and the like are stored in advance.

First, when the computer is turned on, the CPU 51 reads the control program from the ROM 51 and, further, reads the OS from the HD 55 to start the OS. As a result, the computer is ready to install the automatic trace determination program from the storage medium 50.

Next, the storage medium 50 is mounted on the external storage medium drive 57 and a control command is input from the input device 56 to the CPU 51 to read the automatic trace determination process program stored in the storage medium 50 and store it in the HD 55 and the like. Thus, the automatic trace determination process program is installed on the computer.

After that, once the automatic trace determination process program is activated, the computer operates as the automatic trace determination apparatus. An operator can start the automatic trace determination process described above by manipulating the input device 56 according to a specific procedure through an interaction indicated on the display device 58 by the automatic trace determination process program. Data about optimal traces obtained as a result of the automatic computation can be utilized directly in circuit substrate manufacturing equipment or, otherwise, it may be stored in HD 55 or it may be stored once in the storage medium 50 via the external storage medium drive 57.

Here, though the program stored in the storage medium 50 is installed on the HD 55 in the computer of FIG. 21, the present invention is not limited to such an implementation and the program may be installed on the computer through an information transmission medium such as a LAN and the like or the program may be stored in advance in the HD 55 built in the computer.

Next, a specific example of a computer process in an automatic trace determination apparatus according to the present invention will be described as a third variation. In the example described with reference to FIGS. 6-14, tentative or interim traces are allowed to bypass on the assumption that clearances should be secured. However, if the process for securing the clearances is performed every time an interim trace is generated, an amount of computation will be increased. The third variation is intended to reduce the amount of computation of the automatic trace determination process as a whole.

Figure 22:
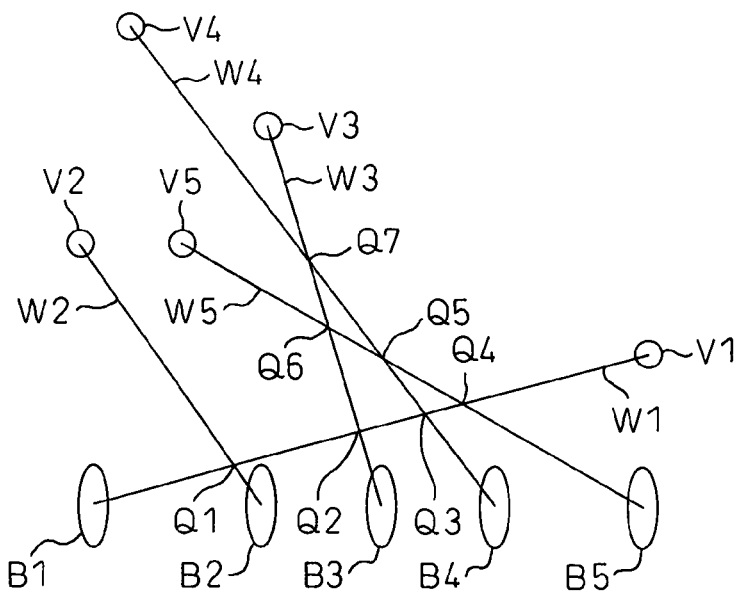
FIGS. 22-35 are diagrams for describing a third variation of an embodiment of the present invention.

FIGS. 22-35 are diagrams for describing the third variation in an embodiment of the present invention. Here, a case in which the third variation is applied to the specific example that has already been shown in FIGS. 6-14 will be described, wherein, in particular, FIG. 22 is the same as FIG. 6.

Figure 23:
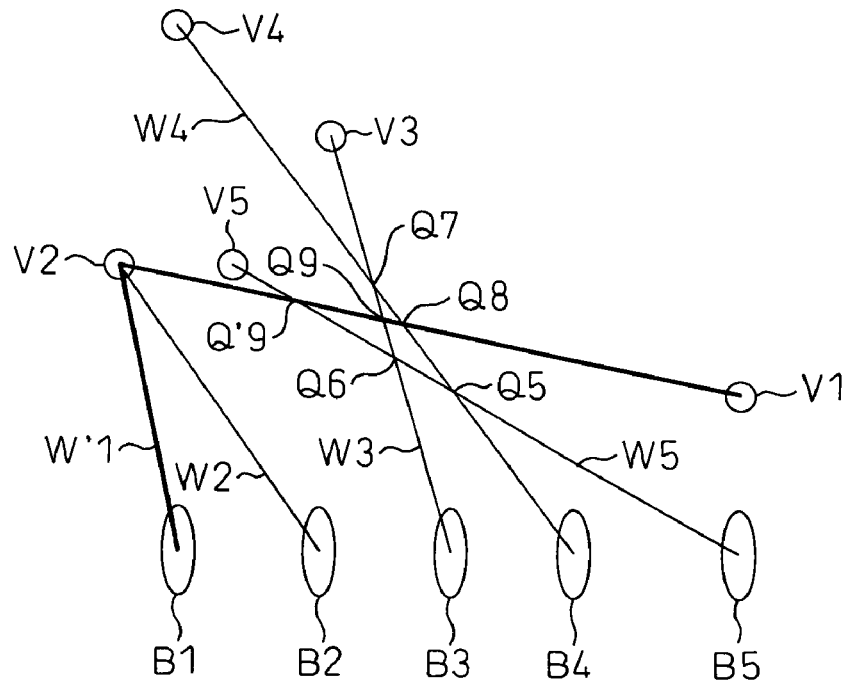

The interim trace W'1 shown in FIG. 7 is generated by allowing the tentative trace W1 shown in FIG. 6 to bypass the via V2. Therefore, in the third variation, as shown in FIG. 23, the interim trace W'1 is disposed tentatively so that it goes on the via V2 to be bypassed.

Figure 24:
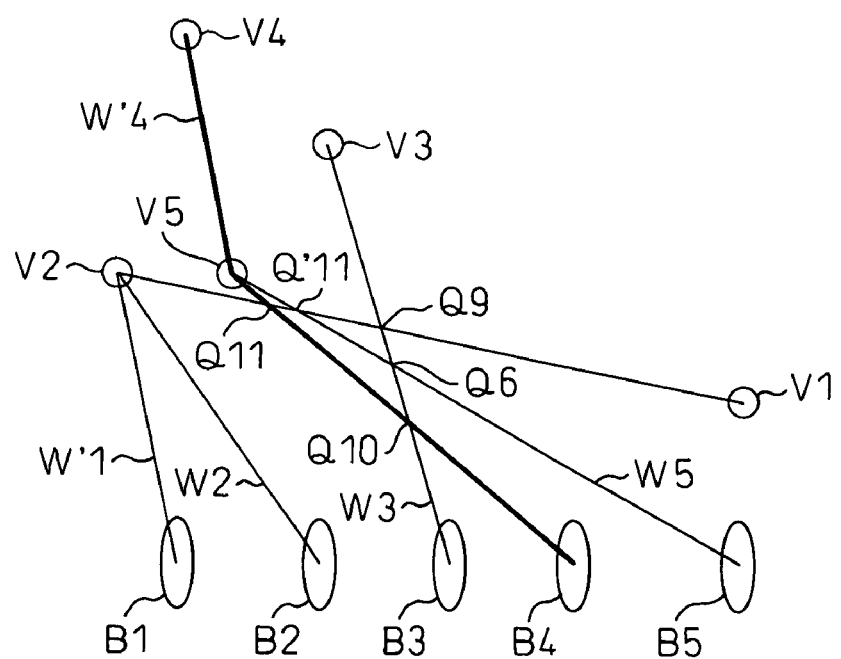

The interim trace W'4 shown in FIG. 8 is generated by allowing the tentative trace W4 shown in FIG. 7 to bypass the via V5. Therefore, in the third variation, as shown in FIG. 24, the interim trace W'4 is disposed tentatively so that it goes on the via V2 to be bypassed.

Figure 25:
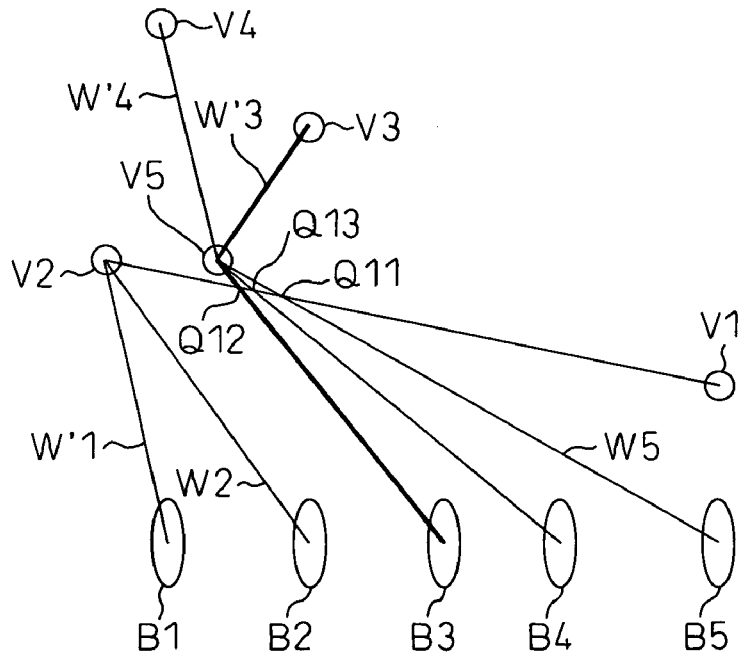

The interim trace W'3 shown in FIG. 9 is generated by allowing the tentative trace W3 shown in FIG. 8 to bypass the via V5. Therefore, in the third variation, as shown in FIG. 25, the interim trace W'3 is disposed tentatively so that it goes on the via V5 to be bypassed.

Figure 26:
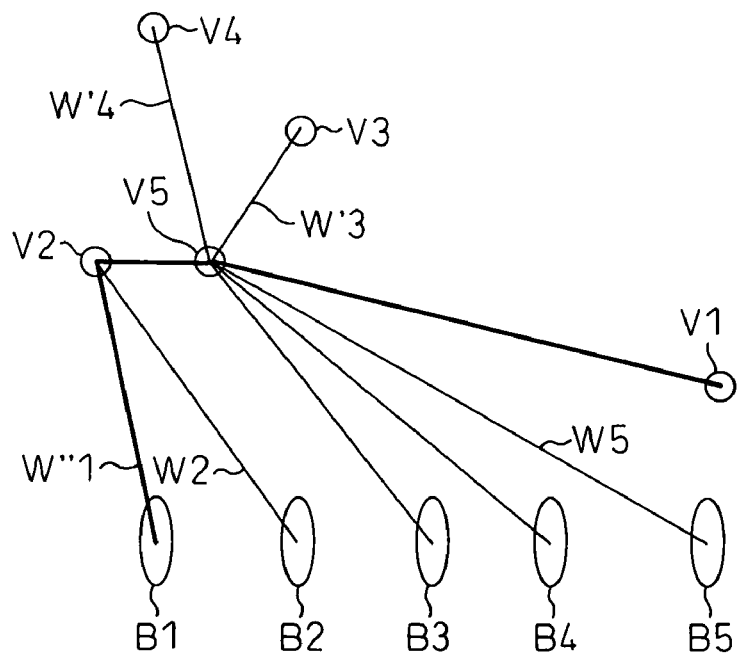

The interim trace W"1 shown in FIG. 10 is generated by allowing the interim trace W'1 shown in FIG. 9 to bypass the via V5. Therefore, in the third variation, as shown in FIG. 26, the interim trace W'1 is disposed tentatively so that it goes on the via V5 to be bypassed.

The interim trace W6 shown in FIG. 13 is generated by allowing the interim trace W'''1 shown in FIG. 12 to bypass the via V4. Therefore, in the third variation, as shown in FIG. 27, the interim trace W6 is disposed on the via V4 to be bypassed.

Figure 27:
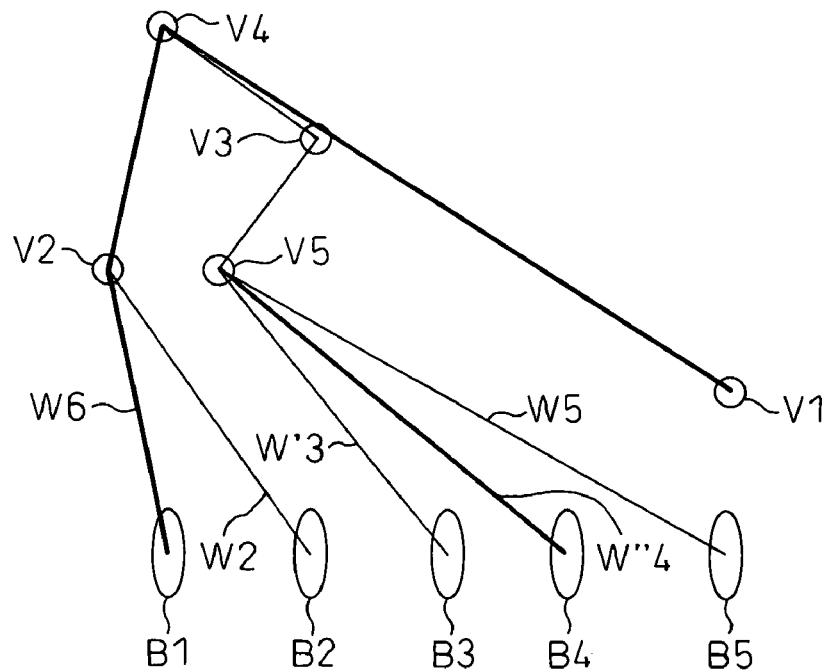

In the state of FIG. 27, the second intersection resolving process is completed and all the intersections between the tentative traces themselves, between the interim traces themselves and between the interim and tentative traces are resolved. However, the tentative and interim traces remain disposed on the vias V2-V5 tentatively and, moreover, the interim traces W'3 and W"4 are disposed between the vias V5 and V3 in an overlapping manner. Thus, in the state of FIG. 27, clearances between the vias, the tentative and interim traces are not secured. Therefore, next, a process for securing the clearances will be performed. More specifically, based on identification information about the tentative traces and/or the interim traces disposed tentatively, this process shifts the tentative traces and/or the interim traces disposed tentatively to dispose them finally and, then, defines them as optimal traces, so that, when all the intersections are resolved by the second intersection resolving process, the clearances between the tentative traces and/or the interim traces disposed tentatively and the adjacent formed elements can be secured. This process is referred to as the "final disposition process" in this specification.

The final disposition process described above is performed sequentially for each row in which the pads and the vias are arranged. Therefore, before performing the final disposition process, the pads and the vias are grouped into rows that are arranged substantially in parallel, with reference to the row in which the pads are arranged, from the pads connected with a semiconductor chip mounted in the center of the substrate toward the vias provided in the peripheral region. As indicated by dotted lines in FIG. 28, the pads and the vias are grouped into the rows indicated by each additional line, such as: the pads are arranged in an additional line A1; the via V1 is arranged in an additional line A2; the vias V2 and V5 are arranged in an additional line A3; the via V3 is arranged in an additional line A4; and the via V4 is arranged in an additional line A5. The final disposition process for securing the clearances between the tentative and/or interim traces disposed tentatively is performed sequentially for each additional line in which the vias are arranged, first, in the forward direction from the pads to the vias and, then, in the direction opposite to the forward direction or in the retrograde direction.

Figure 28:
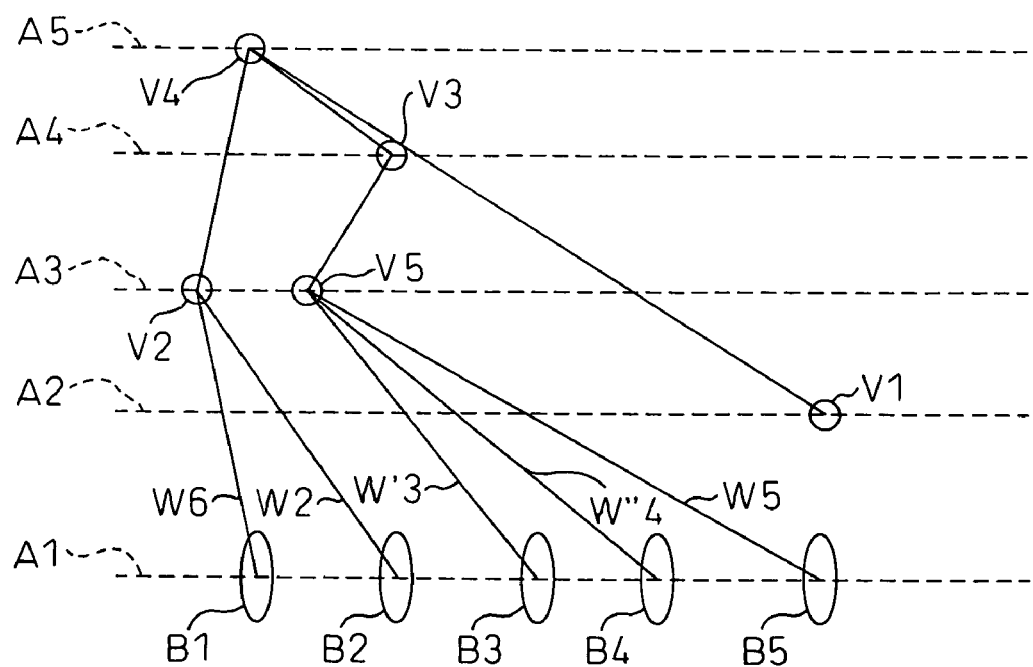
Figure 29:
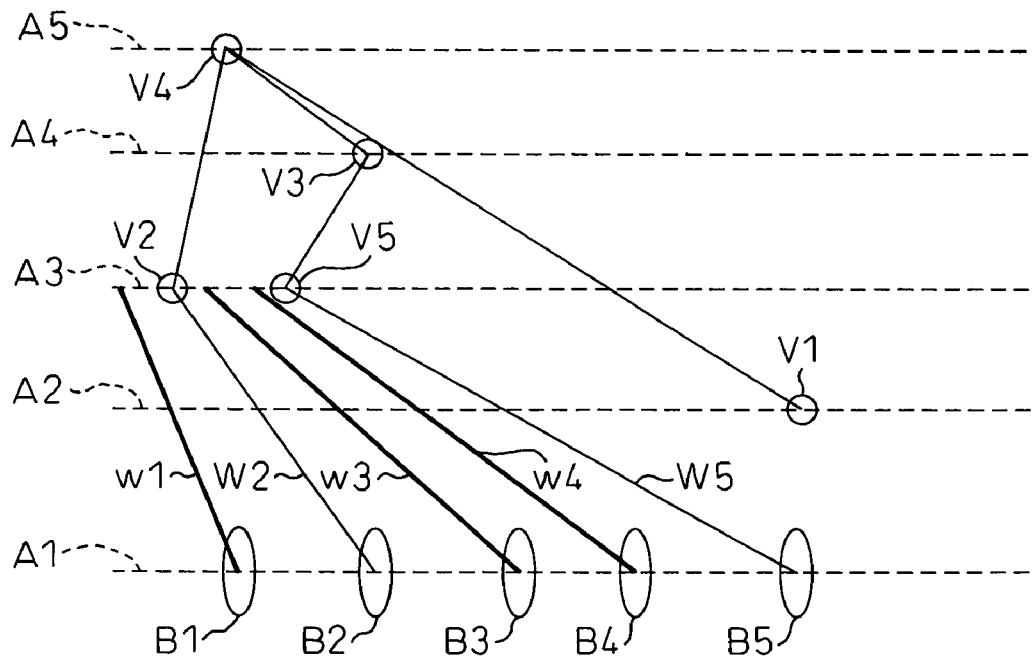

In the state of FIG. 28, the additional line A2 in which the via V1 is arranged is nearest to the additional line A1 in which the pads B1-B5 are arranged. However, the interim trace W6 connected with the via V1 is disposed in the retrograde direction in the vicinity of the via and, therefore, the final disposition process is not performed for this additional line A2.

Next to the additional line A2, the additional line A3 in which the vias V2 and V5 are arranged is nearest to the additional line A1. On the via V2, the interim trace W6 and the tentative trace W2 are disposed in the forward direction and, on the via V5, the interim traces W'3 and W"4 and the tentative trace W5 are disposed in the forward direction. Therefore, the final disposition process is performed first for the additional line A3.

As shown in FIG. 28, while the interim trace W6 and the tentative trace W2 are disposed on the via V2 on the additional line A3, it can be seen, from the identification information in the design data specifying the wiring rules, that the via V2 should be connected not with the interim trace W6 but with the tentative trace W2 and, therefore, the interim trace W6 is shifted from the position on the via V2 to a position where the clearances between the interim trace W6, the via V2 and the tentative trace W2 can be secured. Here, the design rules specify that the pad B1 with which the interim trace W6 is connected and the pad B2 with which the tentative trace W2 is connected are arranged in the order shown in FIG. 28, and that the traces do not intersect with each other and, therefore, the interim trace W6 is shifted in the direction shown in FIG. 29 and it is replaced with an interim trace w1.

Further, as shown in FIG. 28, while the interim traces W'3 and W"4 and the tentative trace W5 are disposed on the via V5 on the additional line A3, it can be seen that the via V5 should be connected not with the interim traces W'3 and W"4 but with the tentative trace W5 and, therefore, the interim traces W'3 and W"4 are shifted from the position on the via V5 to a position where the clearances between the via V5 and the interim and tentative traces can be secured. Here, the design rules specify that the pad B3 with which the interim trace W'3 is connected, the pad B4 with which the interim trace W"4 is connected, and the pad B5 with which the tentative trace W5 is connected are arranged in the order shown in FIG. 28, and that the traces do not intersect with each other and, therefore, the interim traces W'3 and W"4 are shifted in the direction shown in FIG. 29 and the interim traces W'3 and W"4 are replaced with interim traces w3 and w4, respectively.

Figure 30:
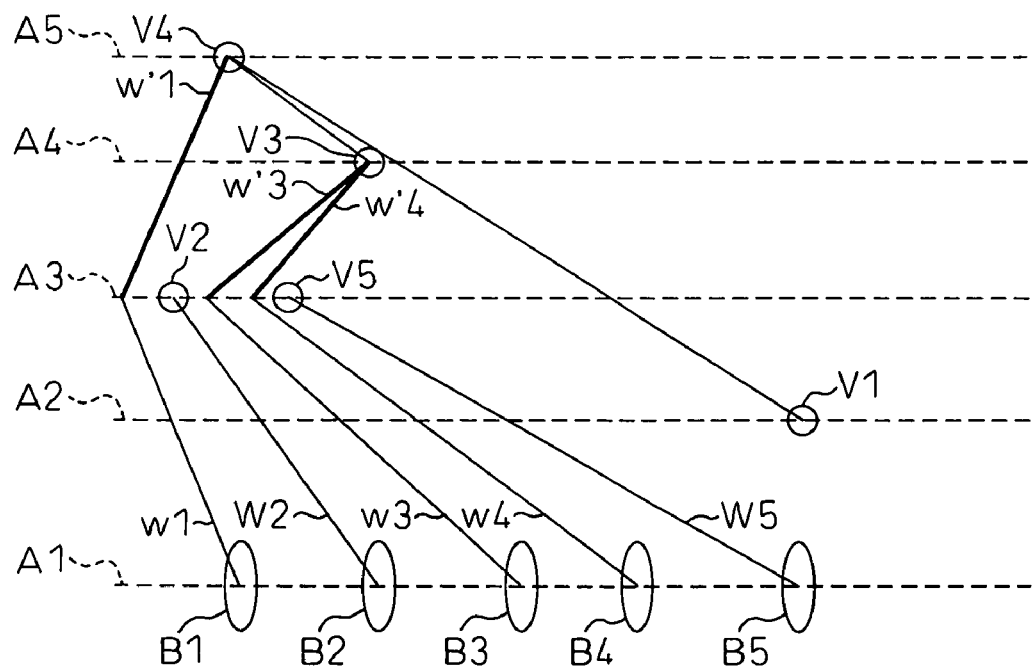
Figure 31:
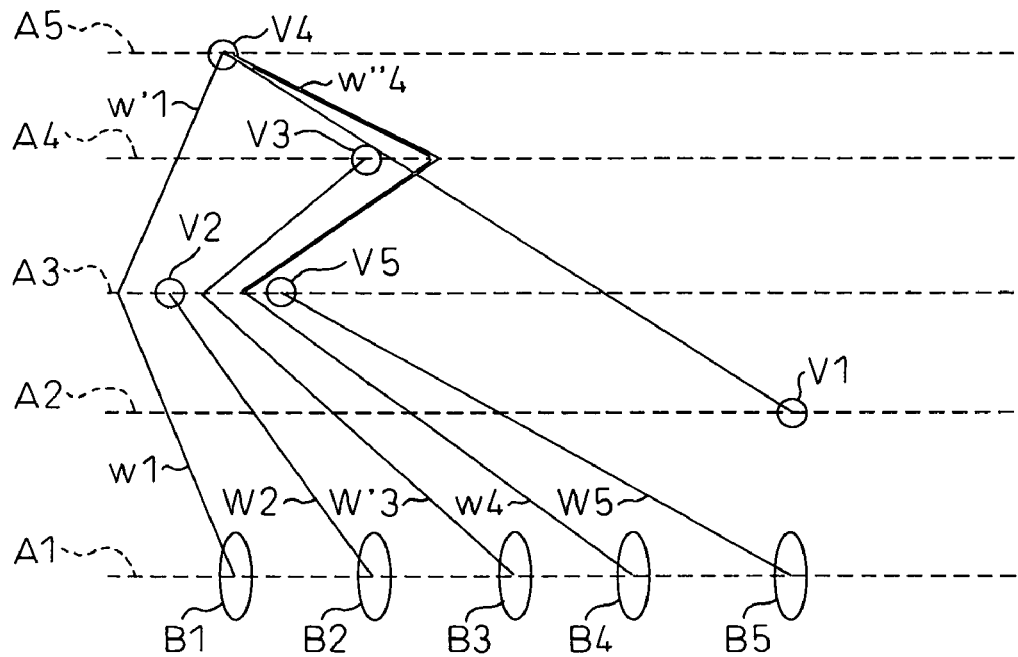

As shown in FIG. 28, the interim trace W6 has been disposed tentatively on the via V4 and, therefore, as shown in FIG. 30, the interim trace w1 is connected with the via V4 through an interim trace w'1. Further, as shown in FIG. 28, the interim trace W'3 is disposed tentatively on the via V3 and, therefore, as shown in FIG. 30, the interim trace w3 is connected with the via V3 through an interim trace w'3. As shown in FIG. 31, an interim trace W'3 is obtained from the interim traces w3 and w'3. Also, as shown in FIG. 28, the interim trace W"4 has been disposed tentatively on the via V3 and, therefore, as shown in FIG. 30, the interim trace w4 is connected with the via V3 through the interim trace w'4.

Figure 32:
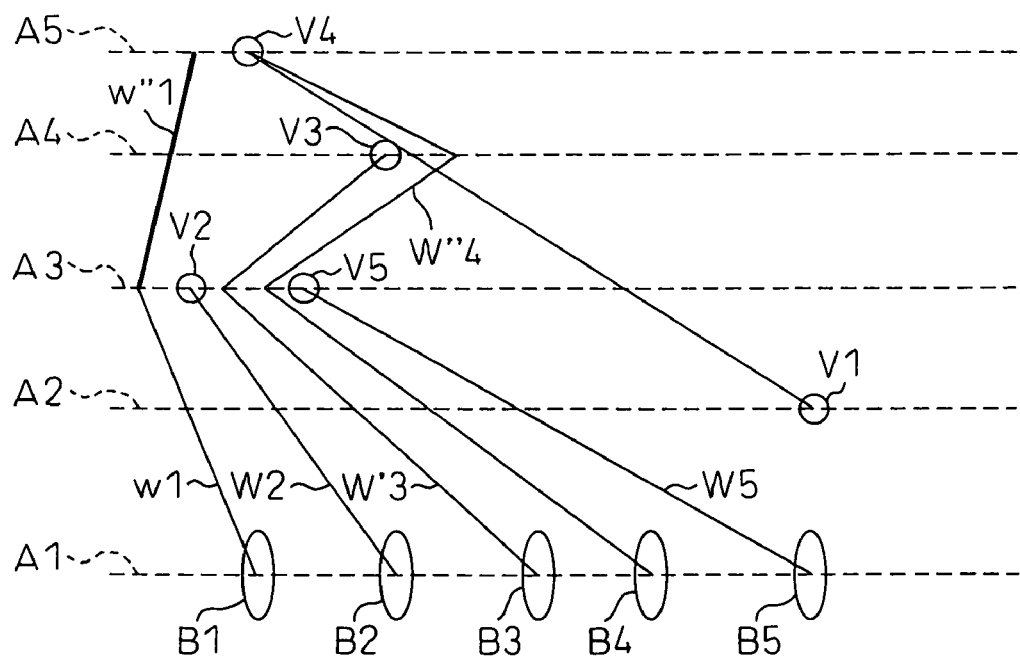

As shown in FIG. 30, the additional line A4 in which the via V3 is arranged is positioned in the forward direction of the additional line A3. On the via V3, the interim traces w'3 and w'4 are disposed in the forward direction. It can be seen, from the identification information in the design data specifying the wiring rules, that the via V3 should not be connected with the interim trace w'4 but should be connected with the interim trace W'3 or, in other words, w'3 and, therefore, the interim trace w'4 is shifted from the position on the via V3 to a position where the clearances between the interim trace w'4, the via V3 and the interim trace W'3 or, in other words, w'3 can be secured. Based on the design data including the identification information about the traces, the interim trace w'4 is shifted in the direction shown in FIG. 31. The shifted trace is extended up to the via V4 and it is shown as an interim trace w"4 in FIG. 31. As shown in FIG. 32, an interim trace W"4 is obtained from the interim traces w4 and w"4 shown in FIG. 31.

As shown in FIG. 31, the additional line A5 in which the via V4 is arranged is positioned in the forward direction of the additional line A4. On the via V4, the interim traces w'1 and w"4 are disposed in the forward direction. It can be seen, from the identification information in the design data specifying the wiring rules, that the via V4 should be connected not with the interim trace w'1 but with the interim trace W"4 or, in other words, w"4 and, therefore, the interim trace w'1 is shifted from the position on the via V4 to a position where the clearances between the interim trace w'1, the via V4 and the interim trace W"4 or, in other words, w"4 can be secured. Based on the design data including the identification information about the traces, the interim trace w'1 is shifted in the direction shown in FIG. 32 and the interim trace w'1 is replaced with an interim trace w"1.

There is no additional line in which the vias are arranged in the forward direction of the additional line A5. Therefore, it can be said that the positions of the traces that should be disposed in the forward direction are determined at this stage. Therefore, next, the final disposition process is performed sequentially for each additional line in the direction opposite to the forward direction or in the retrograde direction.

Figure 33:
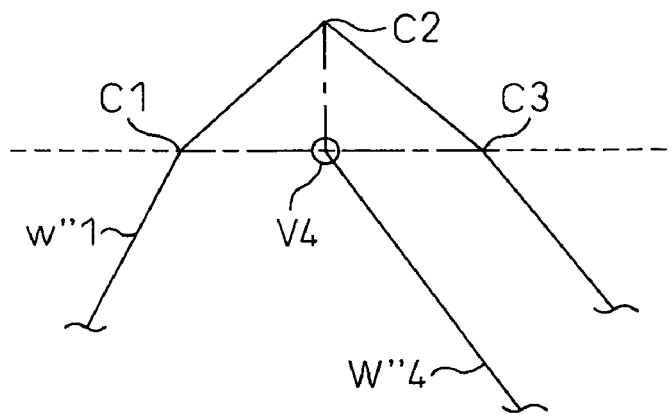

As shown in FIG. 32, the additional line A2 in which the via is arranged is positioned in the retrograde direction of the additional line A5. The interim trace w"1 that is disposed in the forward direction is allowed to bypass the via V4 on the additional line A2 and the interim trace w"1 is extended to the via V1 in the retrograde direction. When the interim trace w"1 is allowed to bypass, as shown in FIG. 33, the interim trace w"1 is connected with the via V1 so that the clearances of distances C1V4, C2V4 and C3V4 can be secured. As a result, the interim trace W6 is obtained as shown in FIG. 34.

Figure 34:
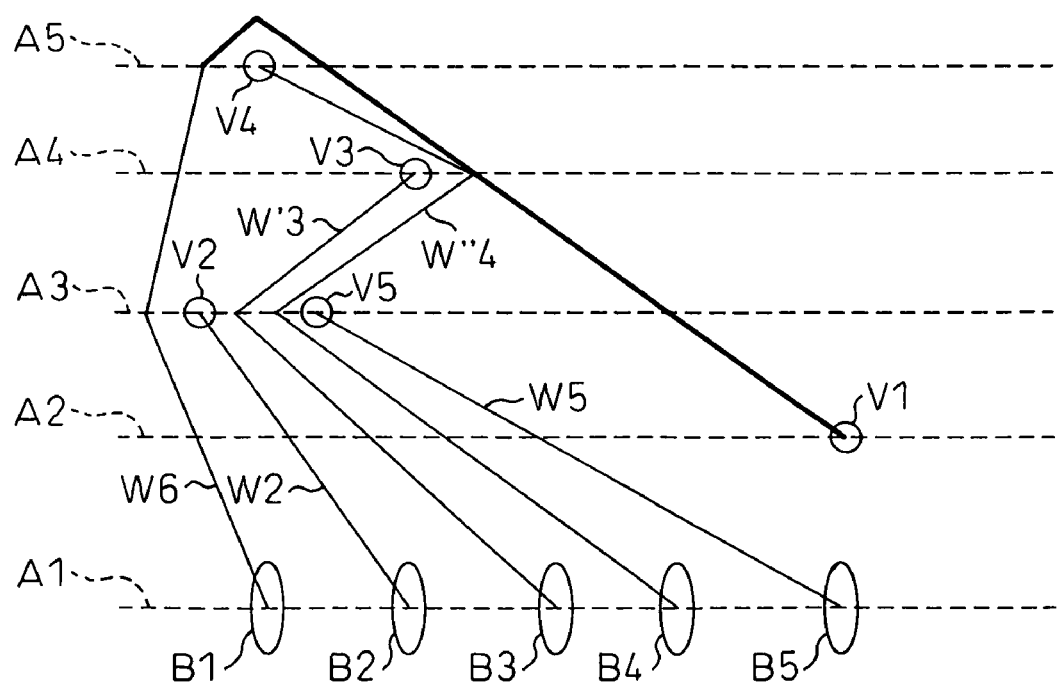
Figure 35:
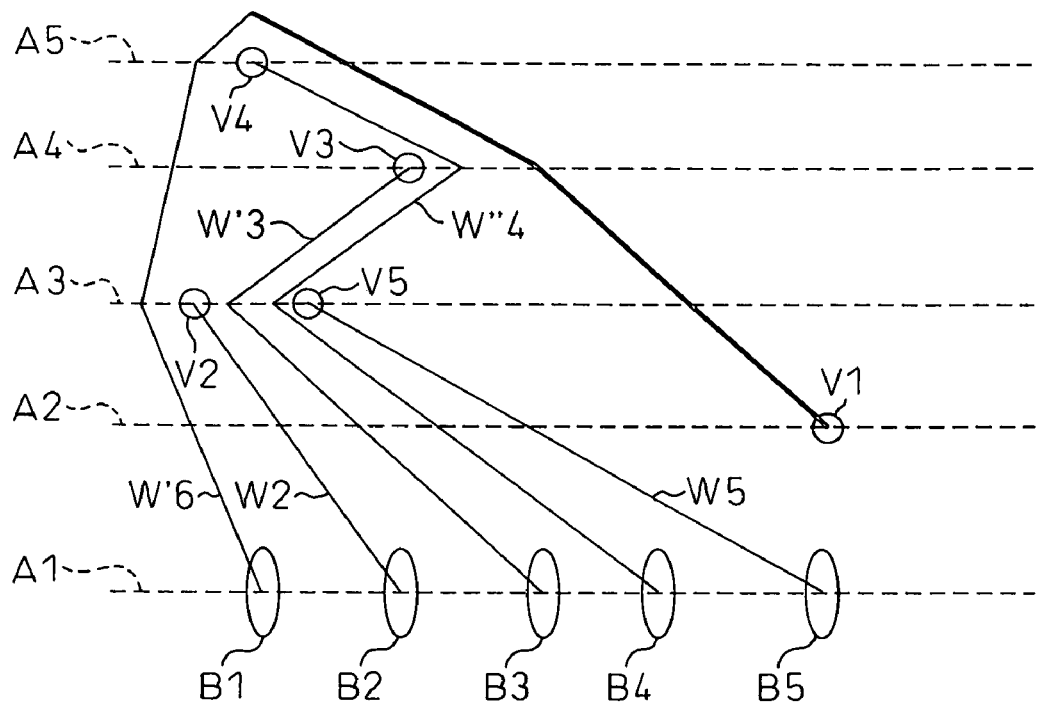
Figure 36:
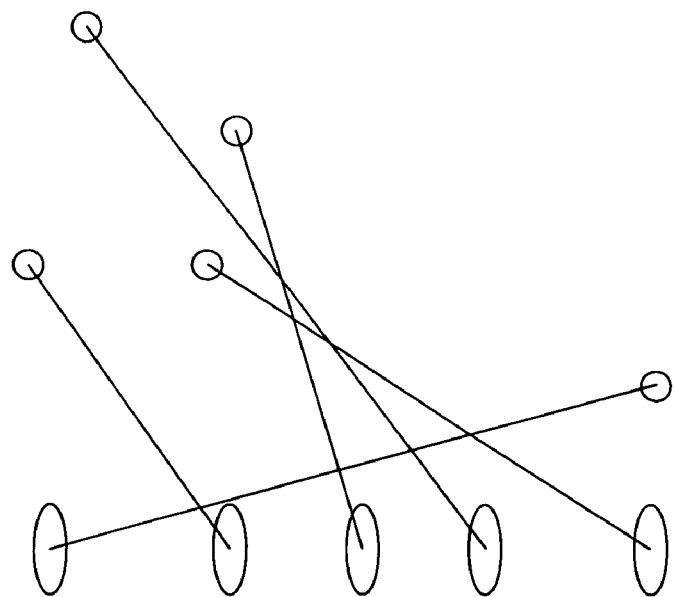
FIG. 36 is a diagram illustrating nets to be wired in a semiconductor package.
Figure 39:
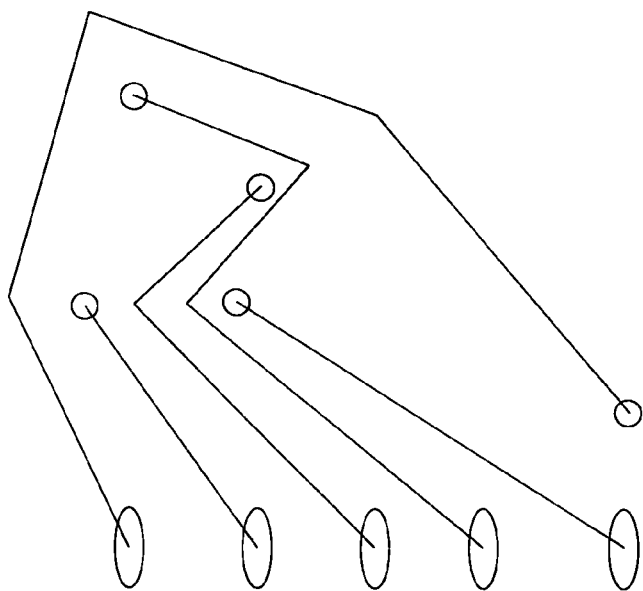
FIG. 39 is a diagram illustrating a case in which wiring routes of the nets shown in FIG. 36 are designed so that the traces are disposed in a well-balanced manner after resolving the intersections.
Figure 40:
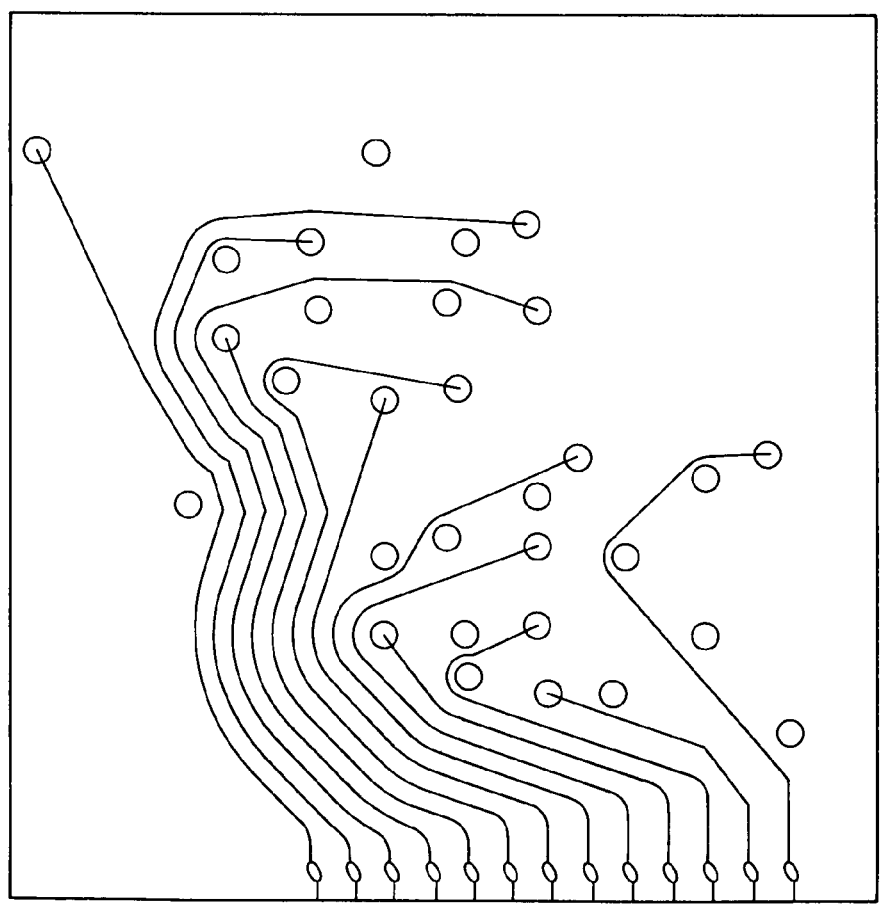
FIG. 40 is a diagram illustrating an example of a retrograde wiring.
Figure 41A:
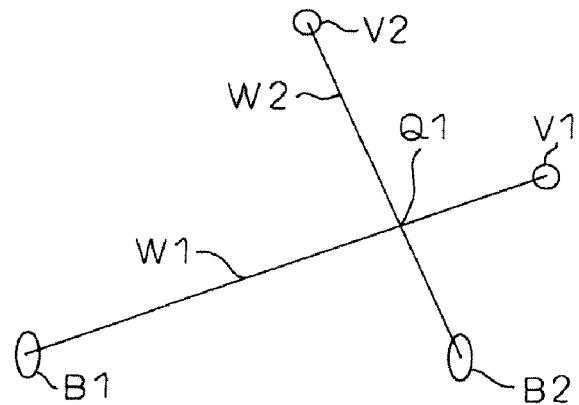
FIGS. 41A-41C are diagrams showing a principle of generation of a retrograde wiring according to a technique as set forth in a document entitled "Rubber-Band Based Topological Router".
Figure 41B:
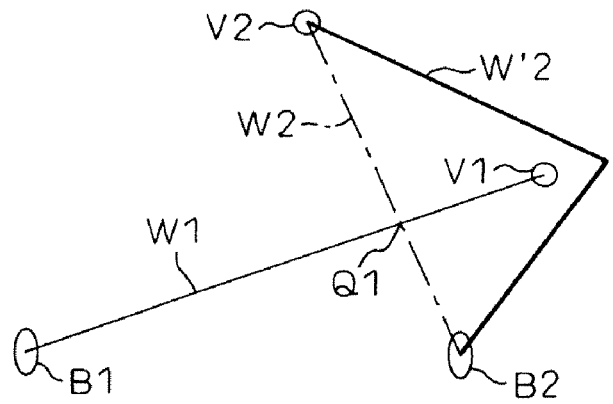
Figure 41C:
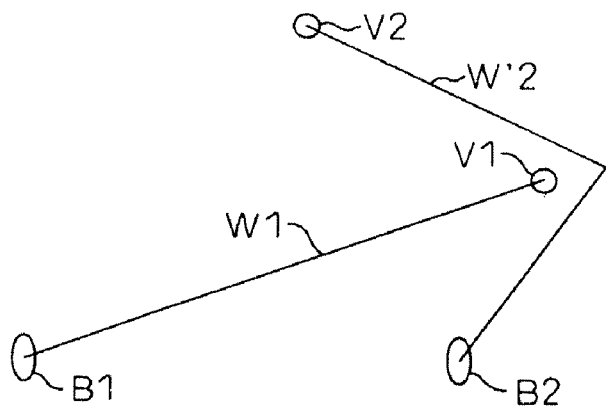

The interim trace W6 shown in FIG. 34 cannot secure the clearance between the interim trace W6 and the interim trace W"4 and, therefore, as shown in FIG. 35, the position of the interim trace W6 is adjusted to obtain an interim trace W'6. In other words, the interim trace W6 connecting between the pad B1 and the via V1 shown in FIG. 34 is replaced with the interim trace W'6 connecting between the pad B1 and the via V1 shown in FIG. 35.

In the state of FIG. 35, all the intersections formed between the tentative traces themselves, between the interim traces themselves and between the interim and tentative traces are resolved and, therefore, the interim trace W'6, the tentative trace W2, the interim trace W'3, the intertive trace W"4 and the tentative trace W5 are defined as optimal traces having retrograde wiring.

Thus, according to the third variation, an amount of computation of the automatic trace determination process in the above-described embodiment and the first and second variation can be reduced as a whole.

As described above, according to the present invention, when optimal trace positions from pads to corresponding vias on a substrate are designed, even if a portion of the traces tends to be oriented in the direction substantially opposite to the dominant direction, the trace positions can be determined automatically by computation using a computer and the like. Thus, the retrograde wiring can be designed according to design rules by the computation using the computer and, therefore, the burden on the designer can be reduced and the trace design can be implemented with stable quality.

According to the present invention, well-balanced wiring routes having retrograde traces with stable quality can be designed in a short time readily without being influenced by the designer's skill, experience, intuition and the like as in the related art. For example, according to the present invention, a computation result, which was obtained through a one to three weeks' work by trial and error in the related-art manual pattern design techniques, can be obtained automatically in only a few days. Because manual design work by trial and error as in the related art becomes unnecessary and, as a result, even if complicated wiring routes are required, high-quality and well-balanced wiring routes can be achieved in a short time. As a result of the reduction of design time and the burden on the designer, manufacturing costs of the semiconductor packages can also be reduced.

In comparison with an ill-balanced wiring pattern, the well-balanced wiring pattern has shorter wiring length and, therefore, it can be more economical and it can be manufactured more easily and it has a lower rate of occurrence of product error in the manufacturing process. Further, it is also electrically stable. Still further, in the substrate in which the wiring pattern is well-balanced, which is deformed substantially uniformly even when it is deformed, for example, due to heat, defects such as a short circuit or break of traces are not likely to occur. Moreover, the semiconductor packages having the wiring pattern with order and regularity to some extent are visually more beautiful and, as a result, advantageous when selling the semiconductor packages.

For example, in the case of wiring substrates that may include retrograde traces, wherein a portion of the traces are oriented in the direction substantially opposite to the dominant direction, such as MCM (Multi-Chip Modules), HDS (High Density Substrates), SIP (Systems in Package) or so on, well-balanced wiring routes can be designed automatically using a processor such as a computer.

What is claimed is:

1. An automatic trace determination apparatus for automatically determining optimal trace positions from pads to corresponding vias on a substrate by computation, comprising:

means for generating tentative traces connecting said pads and said corresponding vias by straight lines;

first intersection resolving means for resolving all intersections formed between tentative traces sequentially from the intersection nearest to said pads, wherein resolving one intersection is performed by retracing one of tentative traces that form said intersection to bypass the corresponding via of the other tentative trace that forms said intersection, and defining this retraced tentative trace as an interim trace;

second intersection resolving means for resolving all intersections formed between said interim traces themselves and intersections formed between said interim and tentative traces sequentially from the intersection nearest to said pads, wherein resolving one intersection is performed by retracing one of the traces that form said intersection to bypass the corresponding via of the other trace that forms said intersection, defining this retraced trace as an optimal trace; and means for defining all tentative or interim traces as optimal traces after the resolving of all intersections by the second intersection resolving means.

2. The automatic trace determination apparatus according to claim 1, wherein said first intersection resolving means are further configured for tentatively disposing said interim trace and retracing it on to corresponding via to be bypassed, and said second intersection resolving means are further configured for tentatively disposing said interim trace and retracing it on to corresponding via to be bypassed.

3. The automatic trace determination apparatus according to claim 2, further comprising determination means for shifting and finally disposing said tentative traces and/or said tentatively disposed interim traces, for determining said optimal trace positions, and for securing the clearances between said tentative traces and/or said tentatively disposed interim traces and the adjacent formed elements, after the resolving of all intersections by said second intersection resolving means.

4. An automatic trace determination apparatus for automatically determining optimal trace positions from pads to corresponding vias on a substrate by computation, comprising:

means for generating tentative traces connecting said pads and said corresponding vias by straight lines;

first intersection resolving means for resolving all intersections formed between tentative traces sequentially from the intersection nearest to said pads, wherein resolving one intersection is performed by determining distances from said intersection to corresponding vias of the tentative traces that form said intersection, retracing the tentative trace associated with the longer distance to said intersection to bypass corresponding via of the other tentative trace associated with the shorter distance to said intersection, and defining this retraced tentative trace as an interim trace;

second intersection resolving means for resolving all intersections formed between said interim traces themselves and intersections formed between said interim and tentative traces sequentially from the intersection nearest to said pads, wherein resolving one intersection is performed by determining distances from said intersection to corresponding vias of the traces that form said intersection, retracing the trace associated with the longer distance to said intersection to bypass corresponding via of the trace associated with the shorter distance to said intersection and defining this retraced trace as a new interim trace; and means for defining all tentative or interim traces as optimal traces after the resolving of all intersections by the second intersection resolving means.

5. The automatic trace determination apparatus according to claim 4, wherein, said first intersection resolving means further comprise of first determination means for determining whether to secure clearance between the interim trace, generated when said tentative trace associated with the longer distance to said intersection is retraced to bypass the via of the trace associated with the shorter distance, the via of the trace associated with the shorter distance and formed elements adjacent to said via, and wherein the first intersection resolving means, after the determination by the first determination means that the interim trace cannot be secured clearance, is further configured for eliminating said interim trace, retracing tentative trace associated with the shorter distance to said intersection to bypass the via of the tentative trace associated with the longer distance, and defining this retraced trace as a new interim trace.

6. The automatic trace determination apparatus according to claim 4, wherein said first intersection resolving means further comprise of:

counting means for counting the number of intersections between the tentative trace associated with said shorter distance and connected with corresponding via to be bypassed and other tentative traces; and second determination means for determining, based on the number of intersections counted by the counting means, whether to secure clearance between interim trace, generated when said tentative trace associated with the longer distance to said intersection is retraced to bypass the via of the trace associated with the shorter distance, the via of the trace associated with the shorter distance and formed elements adjacent to said via, and wherein the first intersection resolving means, after the determination by the second determination means that the interim trace cannot be secured clearance, is further configured for eliminating said interim trace, retracing tentative trace associated with the shorter distance to said intersection to bypass the via of the tentative trace associated with the longer distance, and defining this retraced trace as a new interim trace.

7. The automatic trace determination apparatus according to claim 4, wherein said first intersection resolving means are further configured for tentatively disposing said interim trace and retracing it on to corresponding via to be bypassed, and said second intersection resolving means are further configured for tentatively disposing said interim trace and retracing it on to corresponding on to said via to be bypassed.

8. The automatic trace determination apparatus according to claim 7, further comprising determination means for shifting and finally disposing said tentative traces and/or said tentatively disposed interim traces, for determining said optimal trace positions, and for securing the clearances between said tentative traces and/or said tentatively disposed interim traces and the adjacent formed elements, after the resolving of all intersections by said second intersection resolving means.

9. A computer program stored on a storage medium for allowing a computer to perform an automatic trace determination process for automatically determining optimal trace positions from pads to corresponding vias, the automatic trace determination process comprising:

a step for generating tentative traces connecting said pads and said corresponding vias by straight lines;

a first intersection resolving step for resolving all intersections formed between tentative traces sequentially from the intersection nearest to said pads, wherein resolving one intersection is performed by retracing one of tentative traces that form said intersection to bypass the corresponding via of the other tentative trace that forms said intersection, and defining this retraced trace as an interim trace;

a second intersection resolving step for resolving all intersections formed between said interim traces themselves and intersections formed between said interim and tentative traces sequentially from the intersection nearest to said pads, wherein resolving one intersection is performed by retracing one of the traces that form said intersection to bypass the corresponding via of the other trace that forms said intersection, and defining this retraced trace as an optimal trace; and a step for defining all tentative or interim traces as optimal traces after the resolving of all intersections by the second intersection resolving means.

10. The computer program for allowing a computer to perform an automatic trace determination process according to claim 9, wherein said first intersection resolving step further comprises of tentatively disposing said interim trace and retracing it on to corresponding via to be bypassed, and said second intersection resolving step further comprises of tentatively disposing said interim trace and retracing it on to corresponding via to be bypassed.

11. The computer program for allowing a computer to perform an automatic trace determination process according to claim 10, further comprising a determination step for shifting and finally disposing said tentative traces and/or said tentatively disposed interim traces, for determining said optimal trace positions, and for securing the clearances between said tentative traces and/or tentatively disposed said interim traces and the adjacent formed elements, after the resolving of all intersections by said second intersection resolving step.

\* \* \* \* \*